United States Patent
Platzgummer

(10) Patent No.: US 10,325,756 B2
(45) Date of Patent: Jun. 18, 2019

(54) METHOD FOR COMPENSATING PATTERN PLACEMENT ERRORS CAUSED BY VARIATION OF PATTERN EXPOSURE DENSITY IN A MULTI-BEAM WRITER

(71) Applicant: IMS Nanofabrication GmbH, Vienna (AT)

(72) Inventor: Elmar Platzgummer, Vienna (AT)

(73) Assignee: IMS Nanofabrication GmbH, Vienna (AT)

(*) Notice: Subject to any disclaimer, the term of this patent is extended or adjusted under 35 U.S.C. 154(b) by 0 days.

(21) Appl. No.: 15/620,599

(22) Filed: Jun. 12, 2017

(65) Prior Publication Data
US 2017/0357153 A1 Dec. 14, 2017

Related U.S. Application Data

(60) Provisional application No. 62/349,483, filed on Jun. 13, 2016.

(51) Int. Cl.
*G06F 17/50* (2006.01)
*H01J 37/317* (2006.01)
*G03F 1/78* (2012.01)

(52) U.S. Cl.
CPC ............ *H01J 37/3177* (2013.01); *G03F 1/78* (2013.01)

(58) Field of Classification Search
CPC ............................... G03F 1/78; H01J 37/3177
See application file for complete search history.

(56) References Cited

U.S. PATENT DOCUMENTS 1,033,741 A 7/1912 Sims
1,420,104 A 6/1922 Howe et al.
(Continued)

FOREIGN PATENT DOCUMENTS

CN 202204836 U 4/2012
EP 0178156 A2 4/1986
(Continued)

OTHER PUBLICATIONS

US 9,443,052 B2, 09/2016, Platzgummer et al. (withdrawn)
(Continued)

*Primary Examiner* — Vuthe Siek
(74) *Attorney, Agent, or Firm* — KPPB LLP

(57) ABSTRACT

A method for compensating pattern placement errors during writing a pattern on a target in a charged-particle multi-beam exposure apparatus including a layout generated by exposing a plurality of beam field frames using a beam of electrically charged particles, wherein each beam field frame has a respective local pattern density, corresponding to exposure doses imparted to the target when exposing the respective beam field frames. During writing the beam field frames, the positions deviate from respective nominal positions because of build-up effects within said exposure apparatus, depending on the local pattern density evolution during writing the beam field frames. To compensate, a displacement behavior model is employed to predict displacements; a local pattern density evolution is determined, displacements of the beam field frames are predicted based on the local pattern density evolution and the displacement behavior model, and the beam field frames are repositioned accordingly based on the predicted values.

19 Claims, 15 Drawing Sheets

(56) References Cited

U.S. PATENT DOCUMENTS

| | | |
|---|---|---|
| 1,903,005 A | 3/1933 | McCuen |
| 2,187,427 A | 1/1940 | Middleton |
| 2,820,109 A | 1/1958 | Dewitz |
| 2,920,104 A | 1/1960 | Brooks et al. |
| 3,949,265 A | 4/1976 | Holl |
| 4,467,211 A | 8/1984 | Smith |
| 4,735,881 A | 4/1988 | Kobayashi et al. |
| 4,899,060 A | 2/1990 | Lischke |
| 5,103,101 A | 4/1992 | Neil et al. |
| 5,189,306 A | 2/1993 | Frei |
| 5,260,579 A | 11/1993 | Yasuda et al. |
| 5,369,282 A | 11/1994 | Arai et al. |
| 5,393,987 A | 2/1995 | Abboud et al. |
| 5,399,872 A | 3/1995 | Yasuda et al. |
| 5,533,170 A | 7/1996 | Teitzel et al. |
| 5,814,423 A | 9/1998 | Maruyama et al. |
| 5,841,145 A | 11/1998 | Satoh et al. |
| 5,847,959 A | 12/1998 | Veneklasen et al. |
| 5,857,815 A | 1/1999 | Bailey et al. |
| 5,866,300 A | 2/1999 | Satoh et al. |
| 5,876,902 A | 3/1999 | Veneklasen |
| 5,933,211 A | 8/1999 | Nakasugi et al. |
| 6,014,200 A | 1/2000 | Sogard et al. |
| 6,043,496 A | 3/2000 | Tennant |
| 6,049,085 A | 4/2000 | Ema |
| 6,107,636 A | 8/2000 | Muraki |
| 6,111,932 A | 8/2000 | Dinsmore |
| 6,137,113 A | 10/2000 | Muraki |
| 6,225,637 B1 | 5/2001 | Terashima et al. |
| 6,229,595 B1 | 5/2001 | McKinley |
| 6,252,339 B1 | 6/2001 | Kendall |
| 6,258,511 B1 | 7/2001 | Okino et al. |
| 6,280,798 B1 | 8/2001 | Ring et al. |
| 6,333,138 B1 | 12/2001 | Higashikawa et al. |
| 6,472,673 B1 | 10/2002 | Chalupka et al. |
| 6,473,237 B2 | 10/2002 | Mei |
| 6,552,353 B1 | 4/2003 | Muraki et al. |
| 6,617,587 B2 | 9/2003 | Parker |
| 6,767,125 B2 | 7/2004 | Midas et al. |
| 6,768,123 B2 | 7/2004 | Giering |
| 6,768,125 B2 | 7/2004 | Platzgummer et al. |
| 6,786,125 B2 | 7/2004 | Imai |
| 6,829,054 B2 | 12/2004 | Stanke et al. |
| 6,835,937 B1 | 12/2004 | Muraki et al. |
| 6,858,118 B2 | 2/2005 | Platzgummer et al. |
| 6,897,454 B2 | 5/2005 | Sasaki et al. |
| 6,965,153 B1 | 11/2005 | Ono et al. |
| 7,084,411 B2 | 8/2006 | Lammer-Pachlinger et al. |
| 7,124,660 B2 | 10/2006 | Chiang |
| 7,129,024 B2 | 10/2006 | Ki |
| 7,199,373 B2 | 4/2007 | Stengl et al. |
| 7,201,213 B2 | 4/2007 | Leeson |
| 7,214,951 B2 | 5/2007 | Stengl et al. |
| 7,276,714 B2 | 10/2007 | Platzgummer et al. |
| 7,368,738 B2 | 5/2008 | Platzgummer et al. |
| 7,446,601 B2 | 11/2008 | LeChevalier |
| 7,459,247 B2 | 12/2008 | Bijnen et al. |
| 7,671,687 B2 | 3/2010 | LeChevalier |
| 7,683,551 B2 | 3/2010 | Miyamoto et al. |
| 7,687,783 B2 | 3/2010 | Platzgummer et al. |
| 7,710,634 B2 | 5/2010 | Sandstrom |
| 7,714,298 B2 | 5/2010 | Platzgummer et al. |
| 7,741,620 B2 | 6/2010 | Doering et al. |
| 7,772,574 B2 | 8/2010 | Stengl et al. |
| 7,777,201 B2 | 8/2010 | Fragner et al. |
| 7,781,748 B2 | 8/2010 | Platzgummer et al. |
| 7,823,081 B2 | 10/2010 | Sato et al. |
| 8,057,972 B2 | 11/2011 | Heinrich et al. |
| 8,115,183 B2 | 2/2012 | Platzgummer et al. |
| 8,178,856 B2 * | 5/2012 | Nakayamada ......... B82Y 10/00 250/252.1 |
| 8,183,543 B2 | 5/2012 | Platzgummer et al. |
| 8,198,601 B2 | 6/2012 | Platzgummer et al. |
| 8,222,621 B2 | 7/2012 | Fragner et al. |
| 8,227,768 B2 | 7/2012 | Smick et al. |
| 8,257,888 B2 | 9/2012 | Sczyrba et al. |
| 8,258,488 B2 | 9/2012 | Platzgummer et al. |
| 8,294,117 B2 | 10/2012 | Kruit et al. |
| 8,304,749 B2 | 11/2012 | Platzgummer et al. |
| 8,378,320 B2 | 2/2013 | Platzgummer |
| 8,502,174 B2 | 8/2013 | Wieland |
| 8,531,648 B2 | 9/2013 | Jager et al. |
| 8,546,767 B2 | 10/2013 | Platzgummer et al. |
| 8,563,942 B2 | 10/2013 | Platzgummer |
| 8,598,544 B2 | 12/2013 | Van De Peut et al. |
| 8,859,983 B2 | 10/2014 | Wieland |
| 9,053,906 B2 | 6/2015 | Platzgummer |
| 9,093,201 B2 | 7/2015 | Platzgummer et al. |
| 9,099,277 B2 | 8/2015 | Platzgummer |
| 9,184,026 B2 | 11/2015 | Wieland |
| 9,188,874 B1 | 11/2015 | Johnson |
| 9,269,543 B2 | 2/2016 | Reiter et al. |
| 9,335,638 B2 | 5/2016 | Jager et al. |
| 9,373,482 B2 | 6/2016 | Platzgummer |
| 9,443,699 B2 | 9/2016 | Platzgummer et al. |
| 9,495,499 B2 | 11/2016 | Platzgummer et al. |
| 9,520,268 B2 | 12/2016 | Platzgummer |
| 9,568,907 B2 | 2/2017 | Platzgummer et al. |
| 9,653,263 B2 * | 5/2017 | Platzgummer ...... H01J 37/3177 |
| 9,691,589 B2 | 6/2017 | Van De Peut et al. |
| 9,799,487 B2 | 10/2017 | Platzgummer |
| 9,978,562 B2 | 5/2018 | Van De Peut et al. |
| 2001/0028038 A1 | 10/2001 | Hamaguchi et al. |
| 2002/0021426 A1 | 2/2002 | Mei et al. |
| 2002/0148978 A1 | 10/2002 | Innes et al. |
| 2003/0085360 A1 | 5/2003 | Parker et al. |
| 2003/0106230 A1 | 6/2003 | Hennessey |
| 2003/0155534 A1 | 8/2003 | Platzgummer et al. |
| 2003/0160980 A1 | 8/2003 | Olsson et al. |
| 2004/0058536 A1 | 3/2004 | Ki |
| 2004/0119021 A1 | 6/2004 | Parker et al. |
| 2004/0157407 A1 | 8/2004 | Qin-Yi et al. |
| 2004/0169147 A1 | 9/2004 | Haruhito et al. |
| 2005/0063510 A1 | 3/2005 | Hieronimi et al. |
| 2005/0072941 A1 | 4/2005 | Tanimoto et al. |
| 2005/0104013 A1 | 5/2005 | Stengl et al. |
| 2005/0242302 A1 | 11/2005 | Platzgummer et al. |
| 2005/0242303 A1 | 11/2005 | Platzgummer |
| 2006/0060775 A1 | 3/2006 | Sakakibara et al. |
| 2006/0076509 A1 | 4/2006 | Okino et al. |
| 2006/0169925 A1 | 8/2006 | Miyajima et al. |
| 2007/0138374 A1 | 6/2007 | Nishibashi et al. |
| 2007/0178407 A1 | 8/2007 | Hatakeyama et al. |
| 2007/0279768 A1 | 12/2007 | Shibazaki et al. |
| 2008/0024745 A1 | 1/2008 | Baselmans et al. |
| 2008/0080782 A1 | 4/2008 | Olsson et al. |
| 2008/0099693 A1 | 5/2008 | Platzgummer et al. |
| 2008/0105827 A1 | 5/2008 | Tamamushi |
| 2008/0128638 A1 | 6/2008 | Doering et al. |
| 2008/0142728 A1 | 6/2008 | Smick et al. |
| 2008/0198352 A1 | 8/2008 | Kugler et al. |
| 2008/0203317 A1 | 8/2008 | Platzgummer et al. |
| 2008/0212052 A1 | 9/2008 | Wagner et al. |
| 2008/0237460 A1 | 10/2008 | Fragner et al. |
| 2008/0257096 A1 | 10/2008 | Zhu et al. |
| 2008/0260283 A1 | 10/2008 | Ivansen |
| 2008/0283767 A1 | 11/2008 | Platzgummer |
| 2008/0299490 A1 | 12/2008 | Takekoshi |
| 2009/0032700 A1 | 2/2009 | Park et al. |
| 2009/0101816 A1 | 4/2009 | Noji et al. |
| 2009/0200495 A1 | 8/2009 | Platzgummer et al. |
| 2009/0256075 A1 | 10/2009 | Kemen et al. |
| 2009/0321631 A1 | 12/2009 | Smick et al. |
| 2010/0124722 A1 | 5/2010 | Fragner et al. |
| 2010/0127185 A1 | 5/2010 | Fragner et al. |
| 2010/0127431 A1 | 5/2010 | Sandström |
| 2010/0178602 A1 | 7/2010 | Seto et al. |
| 2010/0187434 A1 | 7/2010 | Platzgummer et al. |
| 2010/0288938 A1 | 11/2010 | Platzgummer |
| 2011/0053087 A1 | 3/2011 | Nielsen et al. |
| 2011/0073782 A1 | 3/2011 | Wieland |
| 2011/0121208 A1 | 5/2011 | Nakayamada et al. |
| 2011/0204253 A1 | 8/2011 | Platzgummer et al. |
| 2011/0226968 A1 | 9/2011 | Platzgummer |

(56) References Cited

U.S. PATENT DOCUMENTS

| | | |
|---|---|---|
| 2012/0001097 A1 | 1/2012 | Yashima et al. |
| 2012/0007002 A1 | 1/2012 | Nakayamada et al. |
| 2012/0076269 A1 | 3/2012 | Roberts et al. |
| 2012/0085940 A1 | 4/2012 | Matsumoto |
| 2012/0151428 A1 | 6/2012 | Tanaka et al. |
| 2012/0211674 A1 | 8/2012 | Kato |
| 2012/0286169 A1 | 11/2012 | Van de Peut et al. |
| 2012/0286170 A1 | 11/2012 | Van de Peut et al. |
| 2012/0288787 A1 | 11/2012 | Choi et al. |
| 2012/0329289 A1 | 12/2012 | Fujimura et al. |
| 2013/0120724 A1 | 5/2013 | Wieland et al. |
| 2013/0128247 A1 | 5/2013 | Khuat et al. |
| 2013/0157198 A1 | 6/2013 | Yoshikawa et al. |
| 2013/0164684 A1 | 6/2013 | Yamanaka |
| 2013/0198697 A1 | 8/2013 | Hotzel et al. |
| 2013/0201468 A1 | 8/2013 | Manakli |
| 2013/0252145 A1 | 9/2013 | Matsumoto et al. |
| 2013/0253688 A1 | 9/2013 | Matsumoto et al. |
| 2014/0042334 A1 | 2/2014 | Wieland |
| 2014/0158916 A1 | 6/2014 | Fujimura |
| 2014/0197327 A1 | 7/2014 | Platzgummer |
| 2014/0240732 A1 | 8/2014 | Tinnemans et al. |
| 2014/0264066 A1 | 9/2014 | Van De Peut et al. |
| 2014/0264086 A1 | 9/2014 | Van De Peut et al. |
| 2014/0322927 A1 | 10/2014 | Morita |
| 2014/0346369 A1 | 11/2014 | Matsumoto |
| 2015/0021493 A1 | 1/2015 | Platzgummer |
| 2015/0028230 A1 | 1/2015 | Platzgummer |
| 2015/0069260 A1 | 3/2015 | Platzgummer |
| 2015/0243480 A1 | 8/2015 | Yamada et al. |
| 2015/0248993 A1 | 9/2015 | Reiter et al. |
| 2015/0311030 A1 | 10/2015 | Platzgummer et al. |
| 2015/0311031 A1 | 10/2015 | Platzgummer et al. |
| 2015/0347660 A1 | 12/2015 | Platzgummer et al. |
| 2016/0012170 A1 | 1/2016 | Platzgummer |
| 2016/0013019 A1 | 1/2016 | Platzgummer |
| 2016/0071684 A1 | 3/2016 | Platzgummer et al. |
| 2016/0276131 A1 | 9/2016 | Platzgummer |
| 2016/0276132 A1 | 9/2016 | Platzgummer |
| 2016/0336147 A1 | 11/2016 | Platzgummer |
| 2018/0218879 A1 | 8/2018 | Platzgummer et al. |

FOREIGN PATENT DOCUMENTS

| | | |
|---|---|---|
| EP | 1033741 A2 | 9/2000 |
| EP | 1993118 A2 | 11/2008 |
| EP | 2019415 A1 | 1/2009 |
| EP | 2187427 A2 | 5/2010 |
| EP | 2214194 A1 | 8/2010 |
| EP | 2317535 A2 | 5/2011 |
| EP | 2363875 A1 | 9/2011 |
| EP | 2950325 A1 | 12/2015 |
| EP | 2993684 A1 | 3/2016 |
| EP | 3037878 A1 | 6/2016 |
| GB | 2349737 A | 11/2000 |
| JP | 08213301 A | 8/1996 |
| JP | 2006019436 A | 1/2006 |
| JP | 2006332289 | 12/2006 |
| WO | 2006084298 A1 | 8/2006 |
| WO | 2008053140 A1 | 5/2008 |
| WO | 2009147202 | 12/2009 |
| WO | 2012172913 A1 | 12/2012 |

OTHER PUBLICATIONS

Extended European Search Report for European Application No. 16169216.5, Search completed Sep. 21, 2016, dated Sep. 29, 2016, 12 Pgs.

Hinterberger, "Ion optics with electrostatic lenses", University of Bonn, Germany, 2006, 18 pgs.

Kim et al., "Binary-encounter-dipole model for electron-impact ionization", Phys. Rev. A 50, 3954 (1994).

Vink et al., "Materials with a high secondary-electron yield for use in plasma displays", Applied Physics Letters, Mar. 25, 2002, vol. 80, No. 12, pp. 2216-2218.

European Search Report for Application 08450077.6, report dated Jan. 29, 2010, 2 pgs.

European Search Report for Application 09450211.9-1226; report dated Sep. 14, 2010; 4 pgs.

European Search Report for application 09450212.7; dated Sep. 28, 2010, 9 pgs.

European Search Report for Application 141501197.7, report dated Jun. 6, 2014, 2 pgs.

European Search Report for Application 14165967, report dated Oct. 30, 2014, 2 pgs.

European Search Report for Application 14165970, report dated Jun. 18, 2014, 2 pgs.

European Search Report for Application 14170611, report dated Nov. 4, 2014, 3 pgs.

European Search Report for Application 14176563, report dated Jan. 14, 2015, 2 pgs.

European Search Report for Application 14177851; report dated Oct. 16, 2014; 1 page.

European Search Report for Application 14199183, report dated Jun. 19, 2015, 2 pgs.

European Search Report for Application 15159397.7, report dated Sep. 28, 2015, 7 pgs.

European Search Report for Application 15159617.8, report dated Oct. 19, 2015, 3 pgs.

European Search Report for Application 15164770, report dated Sep. 18, 2015; 2 pgs.

European Search Report for Application 15164772, report dated Sep. 11, 2015, 2 pgs.

European Search Report for Application 15169632, report dated Oct. 20, 2015, 3 pgs.

European Search Report for Application 15171348, report dated Oct. 30, 2015, 2 pgs.

European Search Report for EP 14176645, completed Dec. 1, 2014, 1 pg.

European Search Report for EP Application No. 16174185, Search Completed Dec. 6, 2016, 2 pgs.

European Search Report for European Application 10450070.7 dated May 7, 2012, 13 pgs.

European Search Report for European Application No. 16160622, Search completed Jul. 21, 2016, dated Jul. 21, 2016, 3Pgs.

Berry et al., "Programmable aperture plate for maskless high-throughput nanolithography", J. Vac. Sci. Technol., Nov. 17, 1997, vol. B15, No. 6, pp. 2382-2386.

Borodovsky, "EUV, EBDW—ARF Replacement or Extension?", KLA-Tencor Lithography User Forum, Feb. 21, 2010, San Jose, CA, USA, 21 pgs.

Borodovsky, "MPProcessing for MPProcessors", SEMATECH Maskless Lithography and Multibeam Mask Writer Workshop, May 10, 2010, New York, NY, USA, 35 pgs.

Disclosed Anonymously, "Multi-tone rasterization, dual pass scan, data path and cell based vector format", IPCOM000183472D, printed from ip.com PriorArtDatabase, published May 22, 2009, 108 pages.

Kapl et al., "Characterization of CMOS programmable multi-beam blanking arrays as used for programmable multi-beam projection lithography and resistless nanopatterning", Journal of Micromechanics and Microengineering, 21 (Mar. 24, 2011), pp. 1-8.

Li et al., "Through-Silicon Interposer Technology for Heterogeneous Integration", Future Fab Intl., Issue 45 (Apr. 25, 2013), 6 pgs.

Paraskevopoulos et al., "Scalable (24-140 Gbps) optical data link, well adapted for future maskless lithography applications", Proc. SPIE vol. 7271, 72711 I (Mar. 17, 2009), 11 pgs.

Platzgummer et al., "eMET POC: Realization of a proof-of-concept 50 keV electron multibeam Mask Exposure Tool", Proc. of SPIE, Oct. 13, 2011, vol. 8166, pp. 816622-1-816622-7.

Platzgummer et al., "eMET—50keV electron Mask Exposure Tool Development based on proven multi-beam projection technology", Proc. of SPIE, Sep. 29, 2010vol. 7823, pp. 782308-1-782308-12.

(56) References Cited

OTHER PUBLICATIONS

Wheeler et al., "Use Of Electron Beams In VLSI", G.E.C. Journal Of Science And Technology, General Electric Company. Wembley, Middlesex, GB, vol. 48, No. 2, Jan. 1, 1982 (Jan. 1, 1982), pp. 103-107, XP000820522.

Zhang et al., "Integrated Multi-Electron-Beam Blanker Array for Sub-10-nm Electron Beam Induced Deposition", J. Vac. Sci. Technol., Nov. 6, 2006, vol. B24, No. 6, pp. 2857-2860.

Extended European Search Report for European Application No. 17153506, Search completed Oct. 5, 2017, dated Oct. 16, 2017, 2 Pgs.

"Dither", Wikipedia, Retrieved from https://en.wikipedia.org/w/index.php?title=Dither&oldid=762118152 on Oct. 5, 2017.

"Ordered dithering", Wikipedia, Retrieved from https://en.wikipedia.org/w/index.php?title=Ordered_dithering&oldid=759840417 on Oct. 5, 2017.

European Search Report for European Patent Application 16160621, Report Completed Oct. 5, 2016, 3 pgs.

Huber et al., "Computing Straight Skeletons and Motorcycle Graphs: Theory and Practice", Univ. of Salzburg (Austria) Jun. 2011, pp. 3-9.

Palfrader et al., Computer-Aided Design & Applications, vol. 12, No. 4, Feb. 11, 2015, pp. 414-424.

Shih, "Image processing and mathematical morphology: fundamentals and applications", CRC Press, 2009, pp. 26-32.

Extended European Search Report for European Application No. 17187922.4, Search completed Feb. 21, 2018, dated Mar. 6, 2018, 7 Pgs.

Extended European Search Report for European Application No. 17191553.1, Search completed Mar. 22, 2018, dated Apr. 9, 2018, 5 Pgs.

\* cited by examiner

METHOD FOR COMPENSATING PATTERN PLACEMENT ERRORS CAUSED BY VARIATION OF PATTERN EXPOSURE DENSITY IN A MULTI-BEAM WRITER

CROSS-REFERENCE TO RELATED APPLICATIONS

This application claims priority to U.S. Provisional Patent Application No. 62/349,483, filed Jun. 13, 2016, and is hereby incorporated by reference in its entirety.

FIELD OF THE INVENTION AND DESCRIPTION OF PRIOR ART

The invention relates to certain improvements in writing a pattern on a target in a charged-particle multi-beam exposure apparatus, and more specifically to a method for compensating pattern placement errors during writing a pattern on a target in a charged-particle multi-beam exposure apparatus, wherein a layout is generated by exposing a plurality of beam field frames using a beam of electrically charged particles, which represent two-dimensional arrangements of pixels on the target and are written in a given time sequence, wherein each beam field frame has a nominal position on the target, and in each beam field frame each pixel has a relative nominal position and an exposure value.

Methods of the above-described type and charged-particle multi-beam processing apparatuses employing such methods are well known in prior art. In particular, the applicant has realized charged-particle multi-beam devices as described in several patents in the name of the applicant with respect to the charged-particle optics, pattern definition (PD) device, and multi-beam writing methods employed therein. For instance, a 50 keV electron multi-beam writer which allows to realize leading-edge complex photomasks for 193 nm immersion lithograph, of masks for EUV lithography and of templates (1x masks) for imprint lithography, has been implemented, called eMET (electron Mask Exposure Tool) or MBMW (multi-beam mask writer), for exposing 6" mask blank substrates. Moreover, a multi-beam system also referred to as PML2 (Projection Mask-Less Lithography) was implemented for electron beam direct write (EBDW) applications on Silicon wafer substrates. Multi-beam processing apparatuses of the said kind are hereinafter referred to as multi-beam writer, or short MBW.

As a typical implementation of an MBW, the applicant has realized a 50 keV electron writer tool implementing a total beam size of 20 nm comprising 512×512 (=262,144) programmable beamlets within a beam array field of dimensions 81.92 μm×81.92 μm at the substrate. In this system, which is referred to as "MBMW tool" hereinafter, the substrate is, typically, a 6" mask blank (having an area of 6"×6"=152.4 mm×152.4 mm and thickness 6"/4=6.35 mm) covered with an electron beam sensitive resist; furthermore, multi-beam writing is possible on resist-covered 150 mm Si wafers as well.

The current density of a typical MBW, such as the MBMW tool, is no higher than 1 A/cm$^2$. When using 20 nm beam size and all programmable 262,144 beamlets are "on" the maximum current is 1.05 μA. In this implementation the 1 sigma blur of the MBW column is approx. 5 nm, as verified experimentally.

Industrial applications impose very demanding MBW performance requirements with respect to achieving a small Critical Dimension (CD; also referred to a minimum feature size) as well as achieving high accuracy in pattern placement. The applicant could realize a MBW having a 3sigma pattern placement performance of below 1 nm, for writing processes with test masks having a uniform local pattern density of 10%. The term "local pattern density" (abbreviated LPd, a more exact term may be "local pattern exposure density") denotes the average level of the exposure values of the pixels in the respective beam field frame; often, the LPd is expressed as a relative value in relation to a (fictitious) pattern of 100% where all pixels (or a given maximal number of pixels) are set at a maximal exposure value. It is remarked that the LPd is different from the (global) pattern density of the entire pattern that is written onto the target.

The LPd strongly varies during writing a pattern, partly because the pattern itself contains regions of various densities of pixels to be exposed so the beam field frames will have varying LPd depending on the region being exposed, partly because the MBW writing method involves a writing strategy where pixels which are written simultaneously, are at a certain distance to each other, which may further convolve the pattern information of the beamlets writing the pixels when seen as a function of time and/or position on the target. Thus, when a realistic pattern is written, the sequence of beam field frames will involve a strong variation of the LPd, often even from frame to frame. A typical variation of the LPd may range from 10% to 75%; of course, depending on the actual application, the range may be wider or narrower.

The inventors found that during writing of a pattern the beam fields are located at a small placement offset from the nominal location of the beam field; this offset is referred to as registration offset or pattern placement error. The occurrence of a pattern placement error is traced back to build-up effects within the MBW imaging system. Such build-up effects are generally due to beam current variations and related effects on the beam position relative to the substrate. In particular, they may be caused by electrical load (due to the electrical charge of the particles used to form the beam (electrons or ions), magnetization (due to electric currents in the blanking device) or thermo-mechanical deformation of certain charged-particle optical components (e.g. electrostatic electrodes) of the imaging system. The inventors observed that this pattern placement error, contrary to the current views, depends on the evolution and history of the LPd during a writing process; moreover, the inventors found that it is possible to describe the behavior of the registration offset (i.e., pattern placement error) in terms of the LPd evolution in a predictable and repeatable manner.

Therefore, starting from a charged-particle multi-beam exposure tool and writing methods possible therein, it is an objective of the invention to find ways for compensating a registration offset by taking into account suitable parameters of the beam field frames that are to be written for generating a desired pattern.

SUMMARY OF THE INVENTION

This objective is achieved by a method as mentioned above, wherein based on LPd values taken for the beam field frames, thus causing a local pattern density evolution as a function of time by virtue of the time sequence of the beam field frames, and in order to compensate for deviations during writing the beam field frames on the target due to placement errors as a result of (often, reversible) build-up effects within said exposure apparatus, the method according to the invention includes the steps of:

establishing parameters of a predetermined displacement behavior model for describing a predicted value of the placement error as a function of LPd and time, providing the sequence of beam field frames, defining times of writing of said beam field frames, determining the local pattern density evolution relating to said sequence of beam field frames and pertinent writing times, predicting values of the placement error for the beam field frames based on the local pattern density evolution and said displacement behavior model, repositioning, for each of the beam field frames and using the respective predicted value of the placement error for the respective beam field frame, the position of the respective beam field frame for compensating the placement error.

Therein, for each beam field frame a LPd value is defined as the average of the exposure values of the pixels in the respective beam field frame, the LPd values defining exposure doses imparted to the target when exposing the respective beam field frames, thus causing a local pattern density evolution as a function of time by virtue of the time sequence of the beam field frames, and during writing the beam field frames on the target, the actual positions thereof deviate from their respective nominal positions by a placement error as a result of build-up effects (such as electrostatic charging effects, magnetization, and thermomechanical effects) within said exposure apparatus, which placement error depends on the local pattern density evolution during writing the beam field frames.

The invention is based on the observation made by the inventors that the registration offset depends on the evolution of the LPd during a writing process, and that the behavior of the registration offset is derivable from the LPd evolution in a predictable and repeatable manner. In fact, the inventors found that the relative placement error converges to a unique and finite value when the LPd remains unchanged for prolonged time, and this convergence generally follows a decay function with a certain parameter, which corresponds, to a time constant. Furthermore, where the LPd is changed, it is often possible to describe the variation of the resulting relative placement error by a suitable combination of decay functions.

One advantageous approach to implement the repositioning functionality in a particle-optical system may be by providing a beam deflection device enabling a repositioning action on a beam field frame as generated on the target according to a desired repositioning distance.

In particular, based on a model to predict the placement error, the step of repositioning the position of the respective beam field frame may include shifting the position of the respective beam field frame by a distance which is the inverse of the respective predicted value of the placement error.

Furthermore, for determining the local pattern density evolution it may greatly reduce the amount of calculations while not deteriorating the quality of the compensation achieved too much, if the LPd evolution is determined for a reduced set of points in time, which each represent one of a sequence of subsequent time intervals (assuming the density of these points in time is sufficient to describe the variation of the LPd over time). For instance, time is divided into time intervals which each contain the times of writing of a plurality of beam field frames. For each time interval a "representative" LPd is determined from the LPds of the beam field frames belonging to the time interval. For instance, this may be done by selecting the local pattern density value of one frame in the respective time interval (e.g. the first frame or the last frame), or by averaging the LPd values of the beam field frames belonging to the respective time slot. As a usual and simple choice, the time intervals may have uniform duration.

For instance, it is possible to determine the parameters of said displacement behavior model by means of in-situ beam position measurements performed in said exposure apparatus as part of a calibration procedure thereof, and (automated) calculation of the respective parameters from results obtained from said in-situ beam position measurements. The term "in-situ", as used herein in connection with a measurement, is to be understood as referring to a measurement process which is performed without loading or unloading of any components into or out of the exposure apparatus; i.e. the in-situ measurement is performed with all components already present within the apparatus.

As another approach, it is possible to establish the parameters of said displacement behavior model by running a sequence of test writing processes in said processing apparatus, said test writing processes performing a sequence of exposures of test patterns having different values of LPd, and preferably in varying sequences in time, wherein in each test writing process the value of placement error is measured as a function of time and/or LPd, and the parameters are calculated from the values of placement error obtained during said test writing processes.

As one example of many, a beam calibration target may be used during said sequence of test writing processes in said exposure apparatus, said beam calibration target comprising a number of a position marker devices located at defined positions on the target, said position marker devices and their positions being detectable using state-of-the-art position measurement methods. These position markers allow to 'in-situ' measure the position of the beam field, or the position of one or several subgroups of beamlets within said beam field relative to a desired nominal position. For instance, a beam calibration target may be realized as an array of apertures, i.e. a metallic shadow mask, placed over a current measurement device such as a faraday cup. Thus, by scanning the beam field or beam subgroups over said beam calibration target, the respective positions can be determined by correlating the value of the current with the respective scan location.

As another example, a mask metrology target may be used during said sequence of test writing processes in said exposure apparatus, said mask metrology target having a surface being provided with a plurality of markers arranged in a regular array thereon. By detecting these markers and measuring the positions thereof, these measured positions can be used to determine the position of the beam subgroups that exposed the respective marker.

Furthermore, it may be suitable to use a displacement behavior model which describes a predicted value of the placement error as a mathematical expression dependent on the time, the local pattern density value of the current beam field frame, as well as the times and local pattern density values of preceding beam field frames, preferably within a time window of predetermined duration. For calculating the parameters of the displacement behavior model, a mathematical expression may be used which consists of a sum of a time-constant base value, which depends on the local pattern density value of the current beam field frame, and at least one decay-function term, which depends on local pattern density values of preceding beam field frames and contains a decay function of time, i.e., $$\hat{F}(LPd,t) = f_0(LPd(t)) + \Sigma_{t'<t} D(LPd(t'), t'-t),$$

Herein $f_0$ represents the final value of displacement for the value of LPd, and $D(X, t)$ represents a decay function which describes the decay from a start value (first argument X) as function of the time (second argument t).

It is expected that the decay function is usually according to an exponential function ($e^{-t/\tau}$ with $\tau$ being a typical time constant to be determined from a calibration measurement), or a linear combination of exponential functions with different typical time constants, and the applicant found that this is well sufficient in realistic applications. However, it is not excluded that generally, the decay function is more general. Thus, more generally, the decay function D may be selected from the group consisting of a decreasing exponential function ($e^{-t/\tau}$), inverse function of time relative to a respective reference time ($(t-t_0)^{-1}$), inverse function of time to an exponent greater than one ($(t-t_0)^{-n}$, $n>1$), or combinations thereof.

Alternatively, the mathematical expression may be represented as a function of a state function ($\phi(t)$) which, for each point in time of exposure (t) is calculated as a function of the values of the local pattern density of preceding points in time and of the state function calculated for preceding points in time, i.e., $$F(LPd,t_{n+1})=f(\phi(t_{n+1})), \phi(t_{n+1})=g(LPd(t_{n-j}), \ldots, LPd(t_n), \phi(t_{n-k}), \ldots, \phi(t_n))$$

wherein the function f( ) describes the displacement behavior as function of the state function, and g( ) describes the time evolution of the state function as a function of the local pattern density and, if applicable, its time derivatives.

As a special case such build-up effects may be considered in the displacement behavior model which are due to current variations in the beam of electrically charged particles; these current variations cause time-variant electric charging of at least one of components in the apparatus and the substrate, for instance by direct beam interaction or by backscattering of particles, or both.

Another type of build-up effects to be considered in the displacement behavior model may be effects due to time-variant heating and resulting thermo-mechanical deformation of at least one of components in the apparatus and the substrate; these effects are caused by variations of the local pattern density and will, through the thermo-mechanical deformation, cause an unintended beam displacement on the substrate.

One advantageous approach for determining the local pattern density evolution is based on data contained in the sequence of beam field frames and pertinent writing times, namely, from data obtained from a data path which serves to calculate data defining a desired pattern into said sequence of beam field frames.

Another suitable approach for determining the local pattern density evolution, which may be implemented alternatively or in combination with the preceding approach, establishes a series of measurements of actual local pattern density, provided by a sensor device provided in the exposure apparatus. For instance, the sensor device may be a measurement device for an electric current arriving at the target, preferably a detector for backscattering of charged particles from the target. Another instance of implementation for the sensor device is a measurement device which is configured to measure those parts of the beam of electrically charged particles that are not arriving at the target, preferably a current detector connected to a stopping plate for blanked beam parts.

Furthermore, in many useful embodiments of a charged-particle multi-beam processing apparatus implementing the method of the invention, the process of writing a desired pattern on said target may comprise the steps of providing a pattern definition device having a plurality of apertures transparent to said radiation, illuminating said pattern definition device by means of an illuminating wide beam, which traverses the pattern definition device through said apertures thus forming a patterned beam consisting of a corresponding plurality of beamlets, forming said patterned beam into a pattern image on the location of the target, said pattern image comprising the images of at least part of the plurality of apertures covering a number of pattern pixels on the target, and generating a relative movement between said target and the pattern definition device producing a stepwise movement of said pattern image on the target along a path over a region where a beam exposure is to be performed, exposing a plurality of pattern pixels in said region.

BRIEF DESCRIPTION OF THE DRAWINGS

In the following, the present invention is illustrated with reference to the drawings, which schematically show.

DETAILED DESCRIPTION OF EMBODIMENTS OF THE INVENTION

The detailed discussion of the invention is given hereinafter in the context of several exemplary embodiments. It will be appreciated that the invention is not restricted to the exemplary embodiments discussed in the following, which are given for illustrative purpose and merely present suitable implementations of the invention. Specifically, first a general description of a multi-beam writer (MBW) tool is provided and how a pattern is written therein (FIGS. 1-7); then, with reference to FIGS. 8-12 follows a discussion of the occurrence of pattern placement errors (registration offset) and compensation of these errors as proposed by the invention, based on an example of a pattern with varying local pattern density. Within this disclosure, the terms "displacement" and "placement error" are used interchangeable and without any distinction.

Lithographic Apparatus

Figure 1:
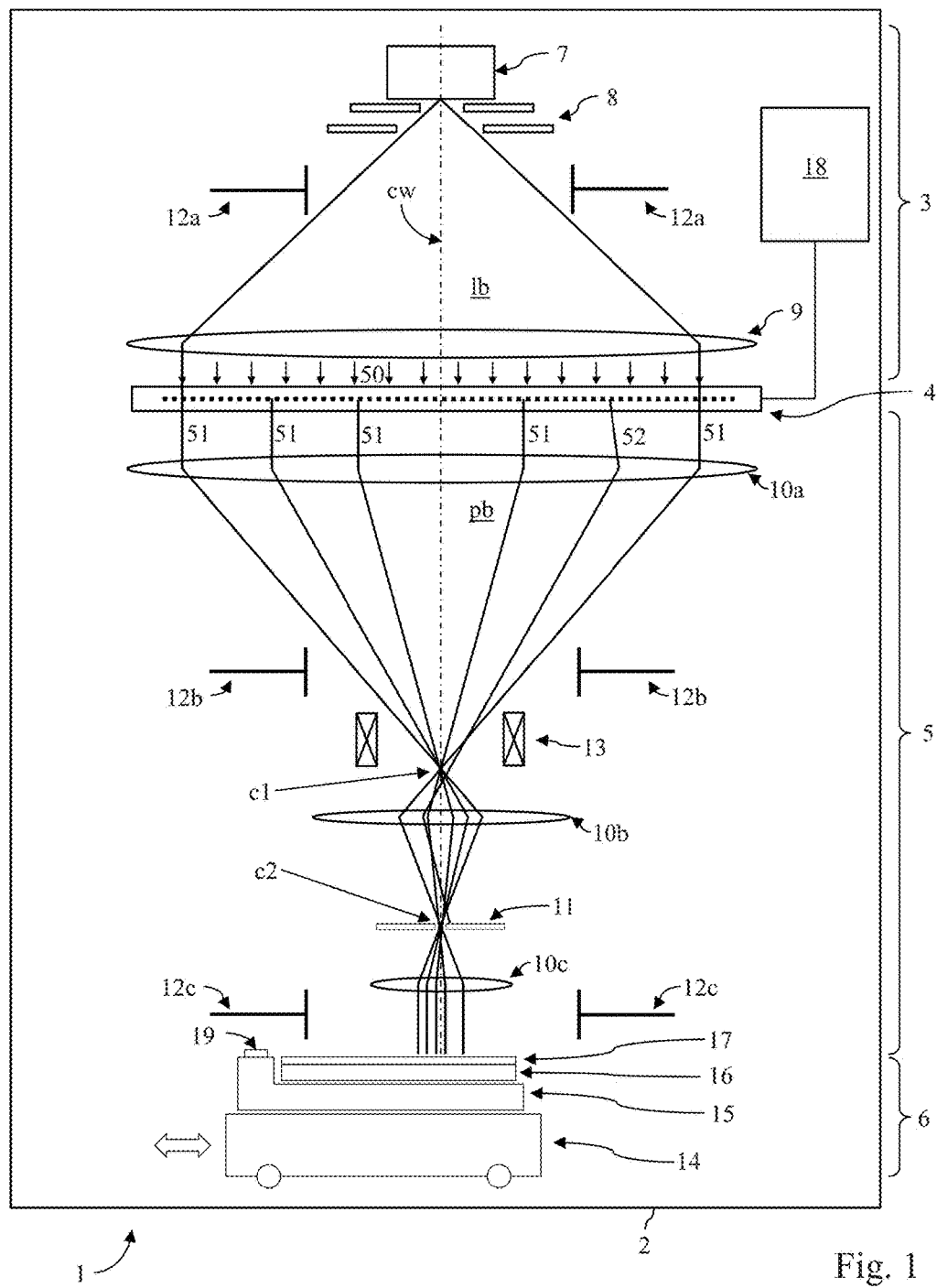
FIG. 1 a MBW system of state of the art in a longitudinal sectional view.

An overview of a lithographic apparatus suitable to employ the preferred embodiment of the invention is shown in FIG. 1. In the following, only those details are given as needed to disclose the invention; for the sake of clarity, the components are not shown to size in FIG. 1. The main components of the lithography apparatus 1 are—corresponding to the direction of the lithography beam lb, pb which in this example runs vertically downward in FIG. 1—an illumination system 3, a pattern definition (PD) system 4, a projecting system 5, and a target station 6 with the substrate 16. The whole apparatus 1 is contained in a vacuum housing 2 held at high vacuum to ensure an unimpeded propagation of the beam lb, pb of charged particles along the optical axis cw of the apparatus. The charged-particle optical systems 3, 5 are realized using electrostatic and/or magnetic lenses forming optical columns.

The illumination system 3 comprises, for instance, an electron gun 7, an extraction system 8 as well as a condenser lens system 9. It should, however, be noted that in place of electrons, in general, other electrically charged particles can be used as well. Apart from electrons these can be, for instance, hydrogen ions or heavier ions, charged atom clusters, or charged molecules.

The extraction system 8 accelerates the particles to a defined energy of typically several keV, e.g. 5 keV. By means of a condenser lens system 9, the particles emitted from the source 7 are formed into a broad, substantially telecentric particle beam 50 serving as lithography beam lb. The lithography beam lb then irradiates a PD system 4 which comprises a number of plates with a plurality of openings (also referred to as apertures). The PD system 4 is held at a specific position in the path of the lithography beam lb, which thus irradiates the plurality of apertures and/or openings and is split into a number of beamlets.

Some of the apertures/openings are "switched on" or "open" so as to be transparent to the incident beam in the sense that they allow the portion of the beam that is transmitted through it, i.e. the beamlets 51, to reach the target; the other apertures/openings are "switched off" or "closed", i.e. the corresponding beamlets 52 cannot reach the target, and thus effectively these apertures/openings are non-transparent (opaque) to the beam. Thus, the lithography beam lb is structured into a patterned beam pb, emerging from the PD system 4. The pattern of switched on apertures—the only portions of the PD system 4 which are transparent to the lithography beam lb—is chosen according to the pattern to be exposed on the substrate 16 covered with charged-particle sensitive resist 17. It has to be noted that the "switching on/off" of the apertures/openings is usually realized by a suitable type of deflection means provided in one of the plates of the PD system 4: "Switched off" beamlets 52 are deflected off their path (by sufficient albeit very small angles) so they cannot reach the target but are merely absorbed somewhere in the lithography apparatus, e.g. at an absorbing plate 11.

The pattern as represented by the patterned beam pb is then projected by means of an electro-magneto-optical projection system 5 onto the substrate 16 where the beam forms an image of the "switched-on" apertures and/or openings. The projection system 5 implements a demagnification of, for instance, 200:1 with two crossovers c1 and c2. The substrate 16 is, for instance, a 6" mask blank or a silicon wafer covered with a particle sensitive resist layer 17. The substrate is held by a chuck 15 and positioned by a substrate stage 14 of the target station 6. The chuck 15 also comprises a beam calibration target 19, which for instance may be realized as a current detector, e.g. of Faraday cup type with a metallic shadow mask on top. This metallic shadow mask contains a set of reference structures which are used for optical measurement and adjustment purposes.

The information regarding the pattern to be exposed is supplied to the PD system 4 by the data path realized by means of an electronic pattern information processing system 18. The data path is explained further below in section "Datapath".

In the embodiment shown in FIG. 1, the projection system 5 is composed of a number of consecutive electro-magneto-optical projector stages 10a, 10b, 10c, which preferably include electrostatic and/or magnetic lenses, and possibly other deflection means. These lenses and means are shown in symbolic form only, since their application is well known in the prior art. The projection system 5 employs a demagnifying imaging through crossovers c1, c2. The demagnification factor for both stages is chosen such that an overall demagnification of several hundred results, e.g. 200:1 reduction. A demagnification of this order is in particular suitable with a lithography setup, in order to alleviate problems of miniaturization in the PD device.

In the whole projection system 5, provisions are made to extensively compensate the lenses and or deflection means with respect to chromatic and geometric aberrations. As a means to shift the image laterally as a whole, i.e. along a direction perpendicular to the optical axis cw, deflection means 12a, 12b and 12c are provided in the condenser 3 and projection system 5. The deflection means may be realized as, for instance, a multipole electrode system which is either positioned near the source extraction system 12a or one of the crossovers, as shown in FIG. 1 with the deflection means 12b, or after the final lens 10c of the respective projector, as in the case with the stage deflection means 12c in FIG. 1. In this apparatus, a multipole electrode arrangement is used as deflection means both for shifting the image in relation to the stage motion and for correction of the imaging system in conjunction with the charge-particle optics alignment system. These deflection means 10a, 10b, 10c are not to be confused with the deflection array means of the PD system 4 in conjunction with the stopping plate 11, as the latter are used to switch selected beamlets of the patterned beam pb "on" or "off", whereas the former only deal with the particle beam as a whole. There is also the possibility to rotate the ensemble of programmable beams using a solenoid 13 providing an axial magnetic field.

Figure 2:
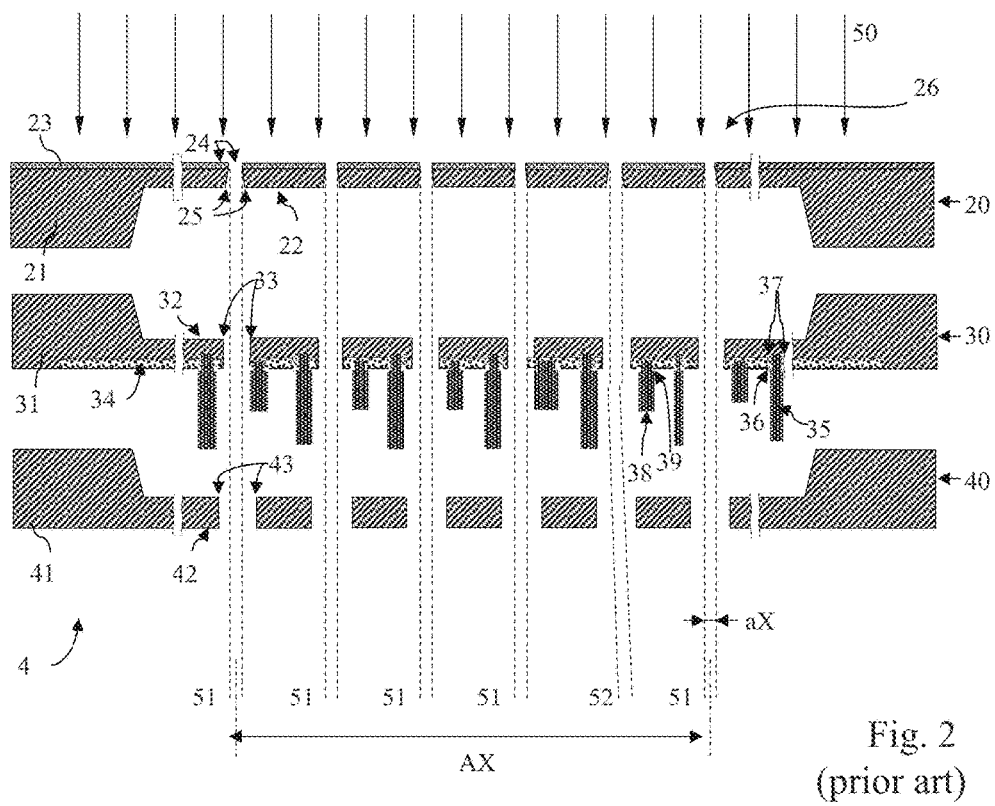
FIG. 2 a PD system of state of the art in a longitudinal section.

The sectional detail of FIG. 2 illustrates one suitable embodiment of a PD system 4, which comprises three plates stacked in a consecutive configuration: An "Aperture Array Plate" (AAP) 20, a "Deflection Array Plate" (DAP) 30 and a "Field-boundary Array Plate" (FAP) 40. It is worthwhile to note that the term 'plate' refers to an overall shape of the respective device, but does not necessarily indicate that a plate is realized as a single plate component even though the latter is usually the preferred way of implementation; still, in certain embodiments, a 'plate', such as the aperture array plate, may be composed of a number of sub-plates. The plates are preferably arranged parallel to each other, at mutual distances along the Z direction (vertical axis in FIG. 2).

The flat upper surface of AAP 20 forms a defined potential interface to the charged-particle condenser optics/illumination system 3. The AAP may, e.g. be made from a square or rectangular piece of a silicon wafer (approx. 1 mm thickness) 21 with a thinned center part 22. The plate may be covered by an electrically conductive protective layer 23 which will be particularly advantageous when using hydrogen or helium ions (line in U.S. Pat. No. 6,858,118). When using electrons or heavy ions (e.g. argon or xenon), the layer 23 may also be of silicon provided by the surface section of 21 and 22, respectively, so that there is no interface between layer 23 and the bulk parts 21, 22.

The AAP 20 is provided with a plurality of apertures 24 formed by openings traversing the thinned part 22. The apertures 24 are arranged in a predetermined arrangement within an aperture area provided in the thinned part 22, thus forming an aperture array 26. The arrangement of the apertures in the aperture array 26 may be, for instance, a staggered arrangement or a regular rectangular or square array (cf. FIG. 4). In the embodiment shown, the apertures 24 are realized having a straight profile fabricated into the layer 23 and a "retrograde" profile in the bulk layer of the AAP 20 such that the downward outlets 25 of the openings are wider than in the main part of the apertures 24. Both the straight and retrograde profiles can be fabricated with state-of-the-art structuring techniques such as reactive ion etching. The retrograde profile strongly reduces mirror-charging effects of the beam passing through the opening.

The DAP 30 is a plate provided with a plurality of openings 33, whose positions correspond to those of the apertures 24 in the AAP 20, and which are provided with electrodes 35, 38 configured for deflecting the individual beamlets passing through the openings 33 selectively from their respective paths. The DAP 30 can, for instance, be fabricated by post-processing a CMOS wafer with an ASIC circuitry. The DAP 30 is, for instance, made from a piece of a CMOS wafer having a square or rectangular shape and comprises a thicker part 31 forming a frame holding a center part 32 which has been thinned (but may be suitably thicker as compared to the thickness of 22). The aperture openings 33 in the center part 32 are wider compared to 24 (by approx. 2 μm at each side for instance). CMOS electronics 34 is provided to control the electrodes 35, 38, which are provided by means of MEMS techniques. Adjacent to each opening 33, a "ground" electrode 35 and a deflection electrode 38 are provided. The ground electrodes 35 are electrically interconnected, connected to a common ground potential, and comprise a retrograde part 36 to prevent charging and an isolation section 37 in order to prevent unwanted shortcuts to the CMOS circuitry. The ground electrodes 35 may also be connected to those parts of the CMOS circuitry 34 which are at the same potential as the silicon bulk portions 31 and 32.

The deflection electrodes 38 are configured to be selectively applied an electrostatic potential; when such electrostatic potential is applied to an electrode 38, this will generate an electric field causing a deflection upon the corresponding beamlet, deflecting it off its nominal path. The electrodes 38 as well may have a retrograde section 39 in order to avoid charging. Each of the electrodes 38 is connected at its lower part to a respective contact site within the CMOS circuitry 34.

The height of the ground electrodes 35 is higher than the height of the deflection electrodes 38 in order to suppress cross-talk effects between the beamlets.

The arrangement of a PD system 4 with a DAP 30 shown in FIG. 2 is only one of several possibilities. In a variant (not shown) the ground and deflection electrodes 35, 38 of the DAP may be oriented upstream (facing upward), rather than downstream. Further DAP configurations, e.g. with embedded ground and deflection electrodes, can be devised by the skilled person (see other patents in the name of the applicant, such as U.S. Pat. No. 8,198,601 B2).

The third plate 40 serving as FAP has a flat surface facing to the first lens part of the downstream demagnifying charged-particle projection optics 5 and thus provides a defined potential interface to the first lens 10a of the projection optics. The thicker part 41 of FAP 40 is a square or rectangular frame made from a part of a silicon wafer, with a thinned center section 42. The FAP 40 is provided with a plurality of openings 43 which correspond to the openings 24, 33 of the AAP 20 and DAP 30 but are wider as compared to the latter.

The PD system 4, and in particular the first plate of it, the AAP 20, is illuminated by a broad charged particle beam 50 (herein, "broad" beam means that the beam is sufficiently wide to cover the entire area of the aperture array formed in the AAP), which is thus divided into many thousands of micrometer-sized beamlets 51 when transmitted through the apertures 24. The beamlets 51 will traverse the DAP and FAP unhindered.

As already mentioned, whenever a deflection electrode 38 is powered through the CMOS electronics, an electric field will be generated between the deflection electrode and the corresponding ground electrode, leading to a small but sufficient deflection of the respective beamlet 52 passing through (FIG. 2). The deflected beamlet can traverse the DAP and FAP unhindered as the openings 33 and 43, respectively, are made sufficiently wide. However, the deflected beamlet 52 is filtered out at the stopping plate 11 of the column (FIG. 1). Thus, only those beamlets which are unaffected by the DAP will reach the substrate.

The reduction factor of the demagnifying charged-particle optics 5 is chosen suitably in view of the dimensions of the beamlets and their mutual distance in the PD device 4 and the desired dimensions of the structures at the target. This will allow for micrometer-sized beamlets at the PD system whereas nanometer-sized beamlets are projected onto the substrate.

The ensemble of (unaffected) beamlets 51 as formed by AAP is projected to the substrate with a predefined reduction factor R of the projection charged-particle optics. Thus, at the substrate a "beam array field" (BAF) is projected having widths $BX=AX/R$ and $BY=AY/R$, respectively, where AX and AY denote the sizes of the aperture array field along the X and Y directions, respectively. The nominal width of a beamlet at the substrate (i.e. aperture image) is given by bX=aX/R and bY=aY/R, respectively, where aX and aY denote the sizes of the beamlet 51 as measured along the X and Y directions, respectively, at the level of the DAP 30. Thus, the size of a single aperture image formed on the target is bX×bY.

It is worthwhile to note that the individual beamlets 51, 52 depicted in FIG. 2 represent a much larger number of beamlets, typically many thousands, arranged in a two-dimensional X-Y array. The applicant has, for instance, realized multi-beam charged-particle optics with a reduction factor of R=200 for ion as well as electron multi-beam columns with many thousands (e.g., 262,144) programmable beamlets. The applicant has realized such columns with a BAF of approx. 82 µm×82 µm at the substrate. These examples are stated for illustrative purpose, but are not to be construed as limiting examples.

Pattern Generation

Figure 3:
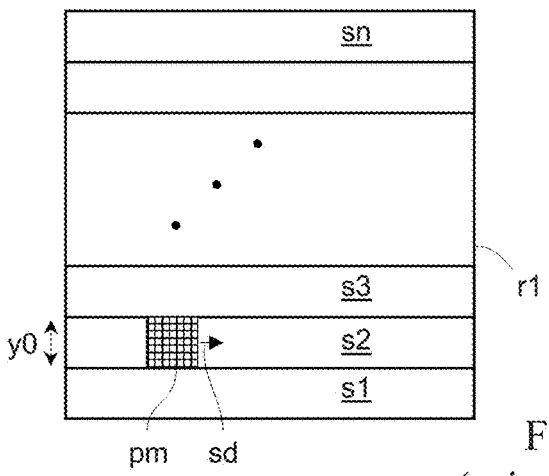
FIG. 3 illustrates the basic writing strategy on the target using stripes.

Referring to FIG. 3, a pattern image pm as defined by the PD system 4 is produced on the target 16. The target surface covered with the charged-particle sensitive resist layer 17 will comprise one or more areas r1 to be exposed. Generally, the pattern image pm exposed on the target has a finite size y0 which is usually well smaller than the width of the area r1 which is to be patterned. Therefore, a scanning stripe exposure strategy is utilized, where the target is moved under the incident beam, so as to change the position of the beam on the target perpetually: the beam is effectively scanned over the target surface. It is emphasized that for the purpose of the invention only the relative motion of the pattern image pm on the target is relevant. By virtue of the relative movement the pattern image pm is moved over the area r1 so as to form a sequence of stripes s1, s2, s3, . . . sn (exposure stripes or scanning stripes), which usually have uniform width y0. The scanning stripes may be directly adjacent or may overlap; the complete set of scanning stripes covers the total area of the substrate surface. The scanning direction sd may be uniform or may change from one stripe to the next. Each stripe contains a sequence of beam field frames, whose contents and sequence are determined in advance in accordance with the pattern that is to be exposed on the target.

Figure 5A:
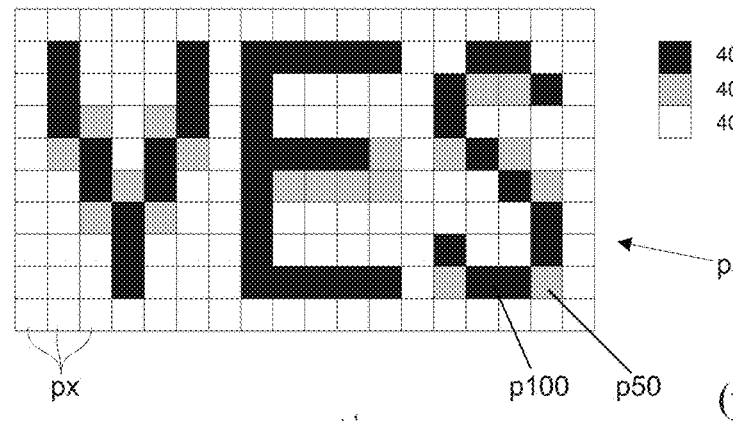
FIGS. 5A and 5B show an example of a pixel map of an exemplary pattern to be exposed.
Figure 5B:
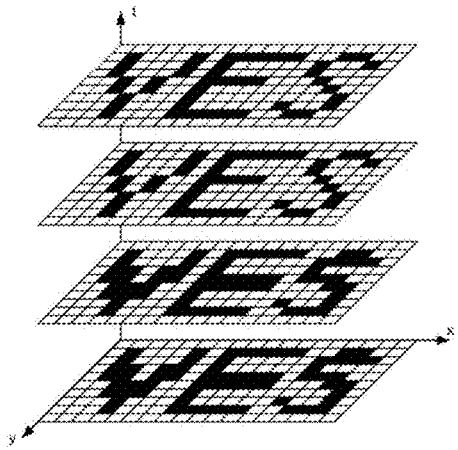

FIG. 5A shows a simple example of an imaged pattern layout ps with a size of 10×16=180 pixels, where some pixels p100 of the exposure area are exposed to a gray level 401 of 100% and other pixels p50 are exposed 402 to only 50% of the full gray level. The remaining pixels are exposed to a 0% dose 403 (i.e., not exposed at all). FIG. 5B illustrates how a 50% level is realized: each pixel is exposed several times, and for a pixel with a gray level between 0 and 100%, the gray level is realized by choosing a corresponding number of the exposures with the pixel activated; the gray level is the fraction of activated exposures over the total number of exposures. In this example, a 50% level is realized by choosing 2 out of 4. Of course, in a realistic application of the invention, the number of pixels of the standard image would be much higher. However, in FIGS. 5A+B the number of pixels is only 180 for the better clarity. Also, in general, much more gray levels will be used spanning the scale from 0% to 100%.

Thus, the pattern image pm (FIG. 3) is composed of a plurality of pattern pixels px, which are exposed with dose values according to the desired pattern to be exposed. It should be appreciated, however, that only a subset of the pixels px can be exposed simultaneously since only a finite number of apertures is present in the aperture field of the PD system. The pattern of switched-on apertures is chosen according to the pattern to be exposed on the substrate. Thus, in an actual pattern not all pixels are exposed at the full dose, but some pixels will be "switched off" in accordance with the actual pattern; for any pixel (or, equivalently, for every beamlet covering the pixel) the exposure dose can vary from one pixel exposure cycle to the next whether the pixel is "switched on" or "switched off", depending on the pattern to be exposed or structured on the target.

While the substrate 16 is moved continuously, the same image element corresponding to a pattern pixel px on the target may be covered many times by the images of a sequence of apertures. Simultaneously, the pattern in the PD system is shifted, step by step, through the apertures of the PD system. Thus, considering one pixel at some location on the target, if all apertures are switched on when they cover that pixel, this will result in the maximum exposure dose level: a "white" shade corresponding to 100%. In addition to a "white" shade, it is possible to expose a pixel at the target according to a lower dose level (also dubbed 'gray shade') which would interpolate between a the minimal ('black') and maximal ('white') exposure dose levels. A gray shade may, for instance, be realized by switching on only a subset of apertures that may be involved in writing one pixel; for example, 4 out of 16 apertures would give a gray level of 25%. Another approach is reducing the duration of unblanked exposure for the apertures involved. Thus, the exposure duration of one aperture image is controlled by a gray scale code, for example an integer number. The exposed aperture image is the manifestation of one of a given numbers of gray shades that correspond to zero and the maximum exposure duration and dose level. The gray scale usually defines a set of gray values, for instance 0, $1/(n_y-1)$ . . . , $i/(n_y-1)$, . . . , 1 with $n_y$ being the number of gray values and i an integer ("gray index", $0 \le i \le n_y$). Generally, however, the gray values need not be equidistant and form a non-decreasing sequence between 0 and 1.

Figure 4:
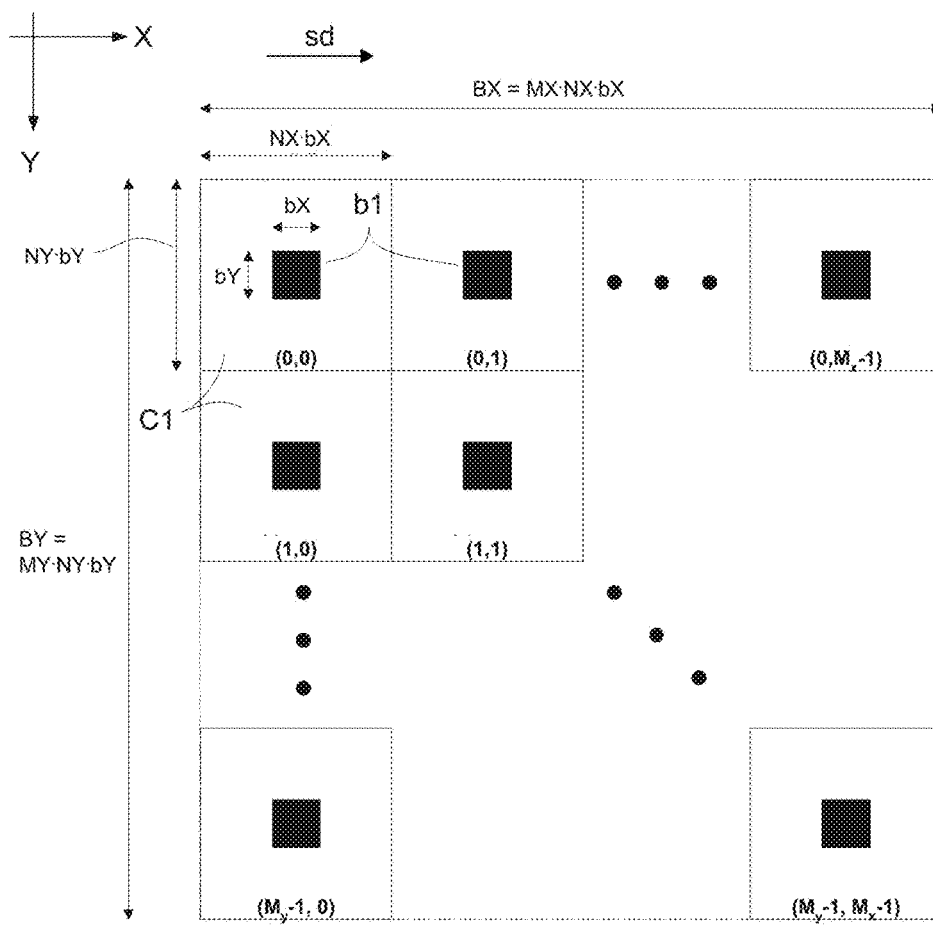
FIG. 4 shows an exemplary arrangement of apertures as imaged onto the target.

FIG. 4 shows the arrangement of apertures in the aperture field of the PD device, according to a basic layout and also illustrates several quantities and abbreviations used in the following. Shown is the arrangement of the aperture images b1 as projected onto the target, shown in dark shades. The main axes X and Y correspond to the direction of advance of the target motion (scanning direction sd) and the perpendicular direction, respectively. Each aperture image has widths bX and bY along the directions X and Y respectively. The apertures are arranged along lines and rows having MX and MY apertures, respectively, with the offset between neighboring apertures in a line and row being NX and NY respectively. As a consequence, to each aperture image belongs a conceptual cell C1 having an area of NX·bX·NY·bY, and the aperture arrangement contains MX·MY cells arranged in a rectangular way. In the following, these cells C1 are referred to as "exposure cells". The complete aperture arrangement, as projected onto the target, has dimensions of BX=MX·NX·bX by BY=MY·NY·bY. In the discussion hereinafter, we will assume a square grid as a special case of a rectangular grid, and set b=bX=bY, M=MX=MY, and N=NX=NY with M being an integer, for all further explanations without any restriction of the generality. Thus, an "exposure cell" has a size of N·b×N·b on the target substrate.

Figure 6A:
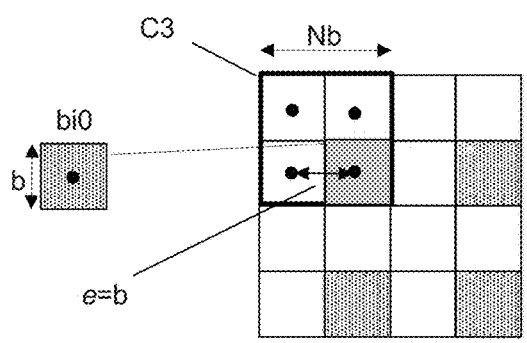
FIG. 6A illustrates an arrangement of apertures with M=2, N=2.

The distance between two neighboring exposure positions is denoted as e in the following. In general, the distance e can be different from the nominal width b of an aperture image. In the simplest case, b=e, which is illustrated in FIG. 6A for the example of an arrangement of 2×2 exposure cells C3, and one aperture image bi0 covers (the nominal position of)

one pixel. In another interesting case, illustrated in FIG. 6B (and in line with the teachings of U.S. Pat. Nos. 8,222,621 and 7,276,714), e may be a fraction b/o of the width b of the aperture image, with o>1 being preferably (but not necessarily) an integer which we also refer to as the oversampling factor. In this case the aperture images, in the course of the various exposures, will spatially overlap, allowing a higher resolution of the placement of the pattern to be developed. It follows that each image of an aperture will, at one time, cover multiple pixels, namely $o^2$ pixels. The entire area of the aperture field as imaged to the target will comprise $(NMo)^2$ pixels. From the point of view of placement of aperture image, this oversampling corresponds to a so-called placement grid which is different (since it is finer in spacing) than what would be necessary to simply cover the target area.

Figure 6B:
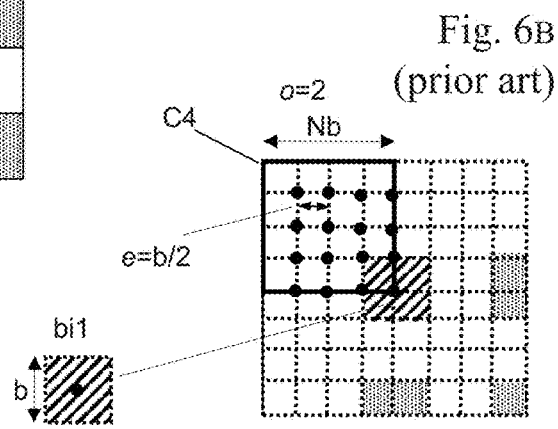
FIG. 6B shows an example of oversampling of the pixels in a "double grid" arrangement.

FIG. 6B illustrates one example of an oversampling of o=2 combined with placement grids, namely, the image of an aperture array with an exposure cell C4 having parameters o=2, N=2. Thus, on each nominal location (small square fields in FIG. 6B) four aperture images bi1 (dashed lines) are printed, which are offset on a regular grid by pitch e in both X and Y directions. While the size of the aperture image still is of the same value b, the pitch e of the image placement grid is now b/o=b/2. The offset to the previous nominal location (offset of the placement grid) is also of size b/2. At the same time, the dose and/or the gray shade of each pixel may be adapted (reduced), by choosing suitable gray value for the aperture image that cover the respective pixel. As a result, an area of size a is printed but with an enhanced placement accuracy due to the finer placement grid. Direct comparison of FIG. 6B with FIG. 6A shows that locations of aperture images are just arranged on a placement grid twice (generally, o times) as fine as before, while the aperture images themselves overlap. The exposure cell C4 now contains $(No)^2$ locations (i.e., "pixels") to be addressed during the write process and thus, by a factor of $o^2$, more pixels than before. Correspondingly, the area bi1 with the size of an aperture image b×b is associated with $o^2=4$ pixels in the case of oversampling with o=2 in FIG. 6B (also called "double grid"). Of course, o may take any other integer value as well, in particular 4 ("quad grid", not shown) or 8, or also a non-integer value greater one, such as $2^{1/2}=1.414$.

It is worthwhile to note that with interlocking grids (o>1) it is possible to increase the number of gray shades by "dithering" while the dose distribution remains homogeneous. The basis for this is that the grey shades on any nominal grid are equal. This means that for the double interlocking grid the number of effective dose levels that can be realized is four times higher than for the non-interlocking grid. Generally speaking any oversampled exposure grid (i.e., o>1) consists of up to $o^2$ nominal grids shifted by distances b/o in X and Y direction. Thus, the step from one dose level to the next can be divided into o sub-steps where the dose level of only one of these o grids is increased; this can be repeated for the other grids until all sub-grids expose the nominal level. As the skilled person will appreciate, the beam shape at the substrate is the convolution of the machine blur and the reduced aperture shape of the aperture plate. It is possible to obtain a homogeneous dose distribution on the substrate by setting the width b to a natural multiple of the exposure grid constant e; in other words, making o=b/e an integer. Otherwise the dose distribution may have minima and maxima with a periodicity the exposure grid, by virtue of aliasing effects. A high number of gray shades allows better feature placement. Therefore increasing the gray levels is of relevance where the gray shades per pixel position are limited to a certain number.

Figure 7A:
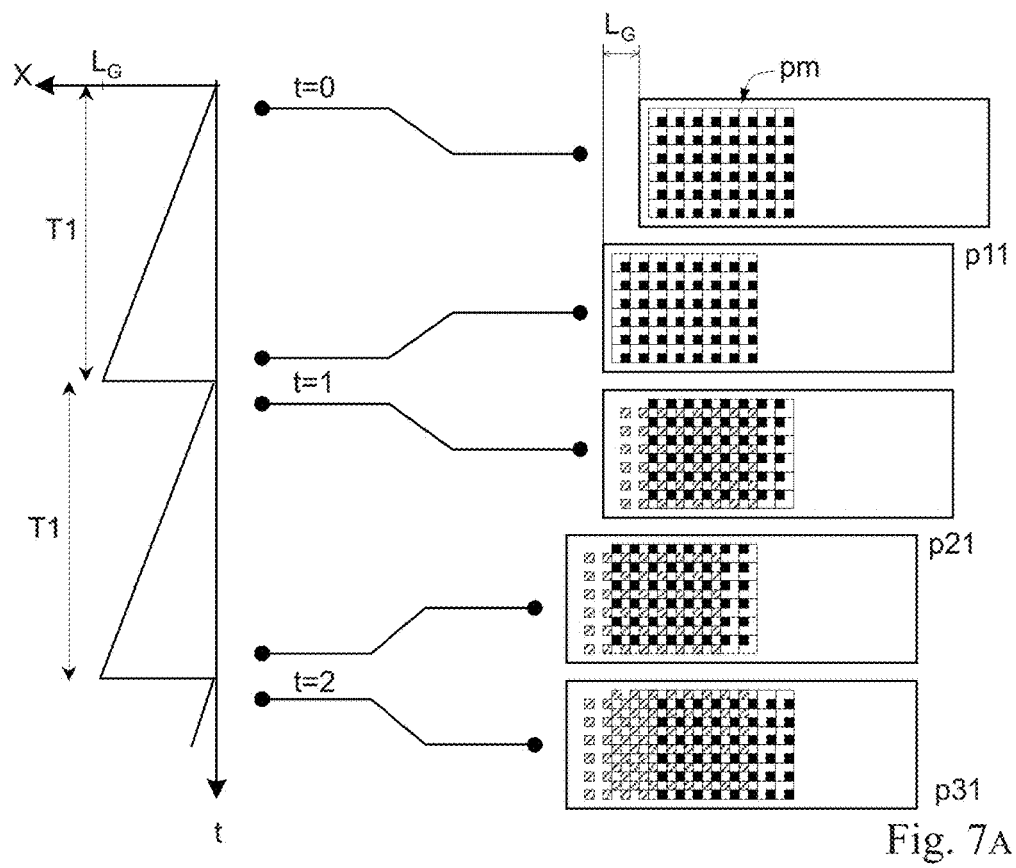
FIG. 7A illustrates the exposure of one stripe.

FIG. 7A shows an exposure scheme of the pixels, which is suitable for the invention. Shown is a sequence of frames, with increasing time from top (earlier) to bottom (later). The parameter values in this figure are o=1, N=2; also, a rectangular beam array is assumed with MX=8 and MY=6. The target moves continuously to the left, whereas the beam deflection is controlled with a seesaw function as shown on the left side of the figure. During each time interval of length T1, the beam image stays fixed on a position on the target (corresponding to a position of a "placement grid"). Thus, the beam image is shown to go through a placement grid sequence p11, p21, p31. One cycle of placement grids is exposed within a time interval L/v=NMb/v, by virtue of the target motion v. The time T1 for exposure at each placement grid corresponds to a length $L_G=vT1=L/(No)^2=bM/No^2$, which we call "exposure length".

The beamlets are moved over the distance of $L_G$ during the exposure of one set of image elements together with the target. In other words, all beamlets maintain a fixed position with regard to the surface of the substrate during the time interval T1. After moving the beamlets with the target along distance $L_G$, the beamlets are relocated instantaneously (within a very short time) to start the exposure of the image elements of the next placement grid. After a full cycle through the positions p11 ... p31 of a placement grid cycle, the sequence starts anew, with an additional longitudinal offset L=bNM parallel to the X direction (scanning direction). At the beginning and at the end of the stripe the exposure method may not produce a contiguous covering, so there may be a margin of length L that is not completely filled.

It is remarked that FIG. 7A neglects the time needed for opening/closing the individual apertures according to the actual pattern. In reality the deflecting devices of the DAP and deflection multipole systems need a certain settling time interval $T_S$, to settle the status of the apertures after repositioning and fading out of transient oscillations. The settling time interval $T_S$ is a (very) small fraction of the pixel exposure cycle T1. Therefore, rather than the entire pixel exposure cycle T1, only a usable time $Tu=T1-T_S$ is used for the exposure of pixels. The time interval Tu is the pixel exposure period within which to ensure that the appropriate dose is passed to the respective pixels. In the following, however, it is assumed that $T_S$ is negligible as compared to T1, and no discrimination is made between Tu and T1 hereinafter.

The usable exposure time Tu is divided into g time slots, corresponding to the number of gray shades possible to address. One value for g would be g=16 (4bit). The pixel exposure is activated according to the desired gray shade, which is the sum of used time slots within Tu. If the dose applied to one pixel within the time Tu is digitized into g gray levels, it is possible to reload a general blanking cell g times during Tu; each blanking cell in the blanking array receives its individual gray shade during the exposure period T1 (or more accurately, the usable time Tu).

Figure 7B:
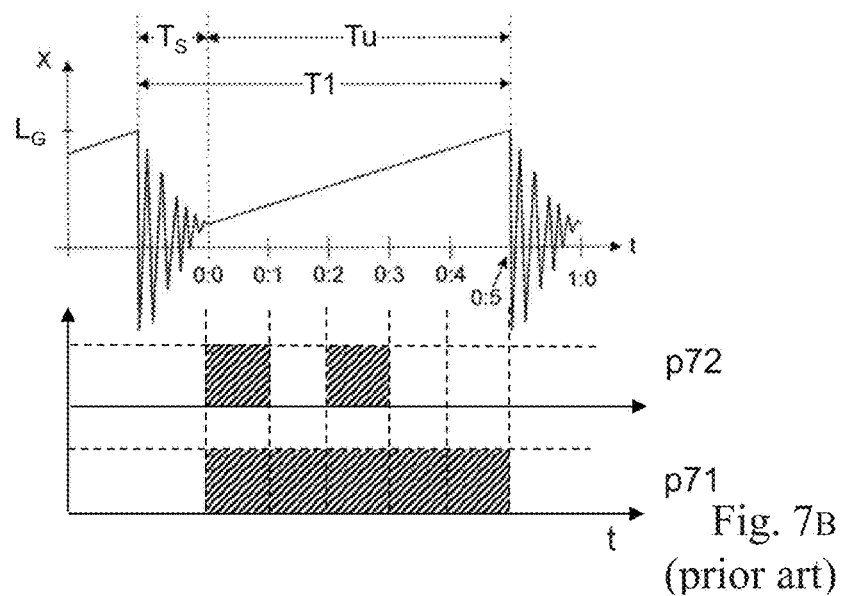
FIG. 7B illustrates the exposure of gray levels.

FIG. 7B illustrates the exposure of two pixels with different gray shades in a simplified example with g=5; the relative size of the settling time interval $T_S$ is greatly exaggerated. In accordance with g=5 there are five time slots in each usable time interval Tu. A first pixel p71 is exposed at a gray shade at 100% (i.e., "black"), and a second pixel p72 at a gray shade of 60%. For pixel p72 two time slots of a corresponding blanking electrode generate a gray shaded pixel; in this example, since 60% corresponds to a gray shade with 2 out of 5, and two of them—in arbitrary order—are set to switched-on. On the other hand, for pixel p71 the respective blanking electrode is activated during all five time slots, thus generating a black pixel with the maximum dose that may be deposited during Tu.

Datapath

Figure 13:
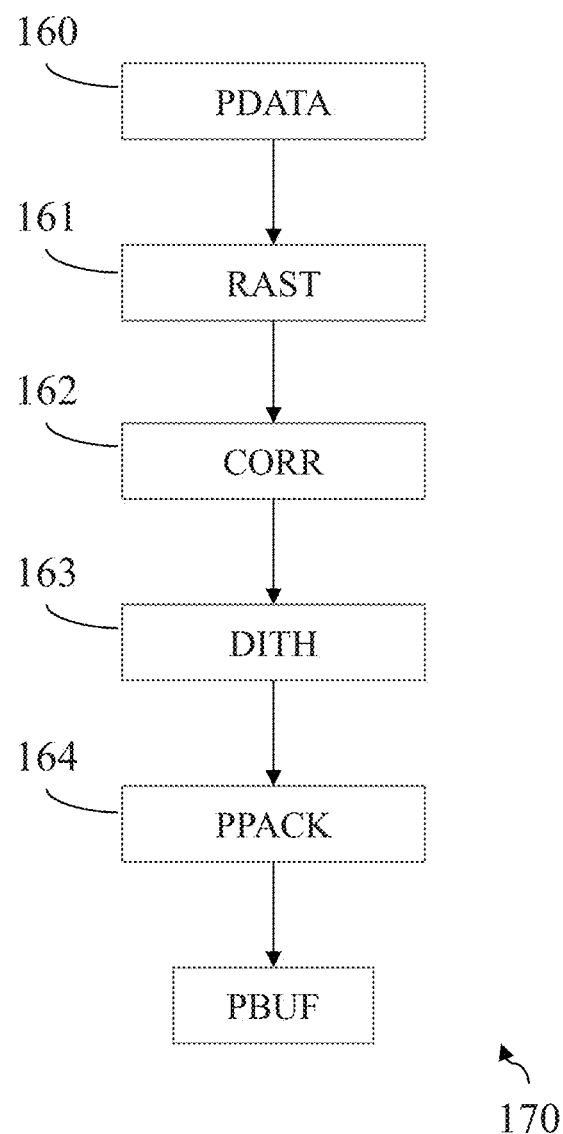
FIG. 13 is a flow diagram of the data path of the MBW.

FIG. 13 shows a flowchart of the datapath in the context of the invention. The data path is preferably performed in the processing system 18 of the writer tool (FIG. 1) in real time; in a variant, part or all of the calculations of the data path may be performed in advance, for instance in a suitable computer.

The complete pattern image comprises a vast amount of image data, which is why for efficient computation of those data a high-speed datapath that generates the pixel data to be exposed, preferably in real-time, will be suitable. The pattern to be exposed is typically described in a vector format, e.g. as a collection of geometries like rectangles, trapezoids or general polygons, which typically offers better data compaction and therefore reduces the requirements on data storage. The datapath therefore consists of three major parts:

a vector-based physical correction process (step 160),
rasterization processes to translate the vector to pixel data (steps 161 to 163), and
buffering of pixel data for temporarily storage for the writing process (step 164).

The datapath starts upon being supplied a pattern PDATA to be exposed at step 160. In step 160, the pattern PDATA to be exposed is split into a large number of small data chunks, possibly with geometric overlaps. Corrections that can be applied in the vector domain (e.g. proximity effect correction) may be carried out to all chunks independently, possibly in parallel, and the resulting data is sorted and coded in a way to improve computation speed of the following steps. The output is a collection of chunks where all chunks contain a collection of geometries.

Stage 161: Rasterization RAST. The geometries of every chunk are converted into a raster graphics array, where the pixel gray level represents the physical dose of the corresponding aperture image. Every pixel that is completely inside a geometry is assigned the color of the polygon, whereas the color of pixels that cross an edge of a geometry is weighed by the fraction of the area of the pixel that is covered by the geometry. This method implies a linear relation between the area of the geometry and the total dose after the rasterization. The doses are first calculated as floating point numbers; only later, they are converted to the discrete set of dose values as supported by the PD device. As a result of rasterization, the pixel data will be in the format of floating point numbers representing nominal dose values P for the respective pixels.

Stage 162: Pixel based corrections CORR, such as compensation of deviations from a uniform current density of the beam 50 over the aperture field, and/or correction for individual defective beam deflectors in the DAP 30. Correction methods of this kind do not form part of the invention and are not discussed here.

Stage 163: Dithering DITH. The dithering process converts the convoluted, and possibly corrected, dose value data into gray value data, based on a predetermined gray value scale. This is a position-dependent rounding process that ensures that rounding errors are averaged over nearby pixels which, combined with oversampling, allows for a much finer dose variation than with the discrete set of dose values available for a single aperture; it can be realized by means of known algorithms for the conversion of visual image data into pixel graphics. It is possible to apply additional corrections (which are not part of the present invention) at this stage, provided they can be applied in the pixel domain, immediately before or after dithering depending on the actual correction (e.g. defective apertures correction).

Stage 164: Pixel packaging, PPACK. The pixel image obtained from stage 164 is sorted according to the placement grid sequence and sent to a pixel buffer PBUF, which is provided in the processing system 18 of the writer tool (FIG. 1). The pixel data is buffered until a sufficient amount of data, typically at least the length of a stripe, is present which triggers the exposure of the stripe. The data is taken out of the buffer during the writing process. After the stripe has been written, the process described above starts anew for the pattern data of the next region, such as the next stripe.

Effect of Varying Local Pattern Density

Figure 8:
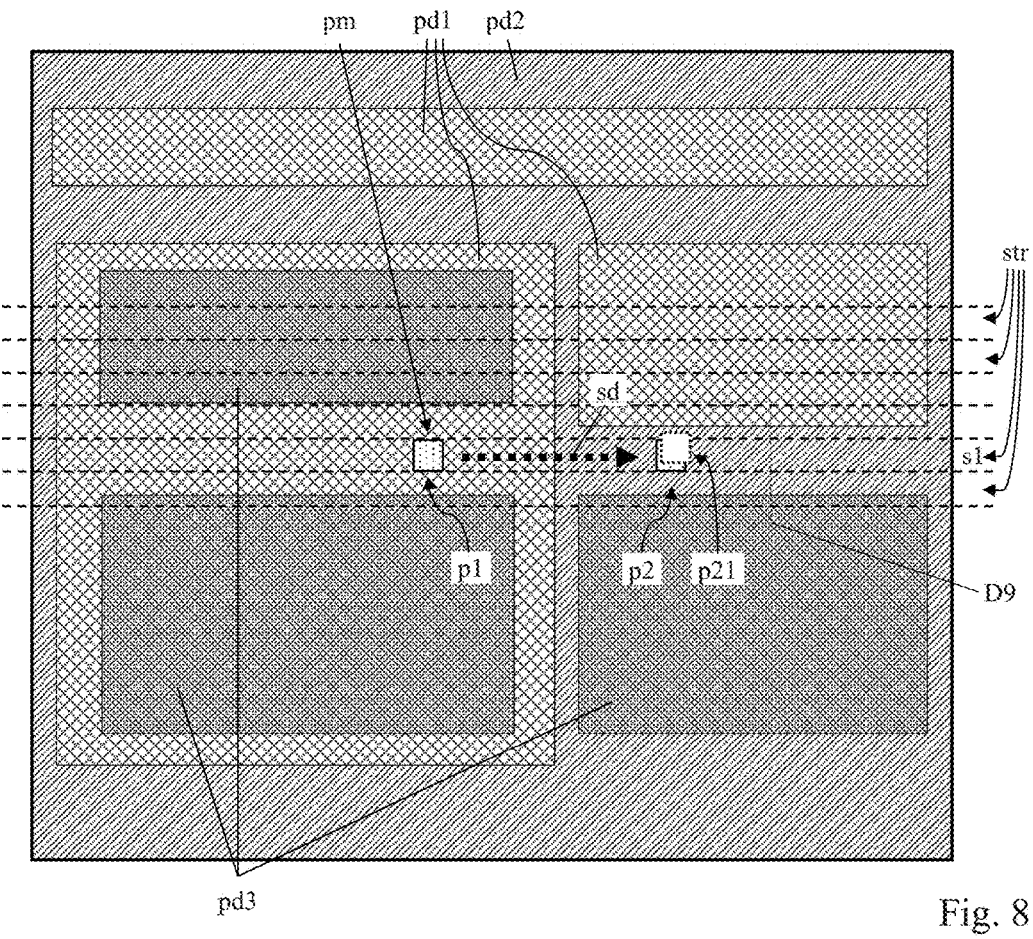
FIG. 8 shows an example of a pattern layout to illustrate the LPd-dependent placement error that is compensated according to the invention.

FIG. 8 shows a simplified example of a part of a pattern layout (short: layout) which is to be generated on a target such as a resist-covered silicon wafer. The layout has spatially varying local pattern density (abbreviated LPd), indicated as areas having different hatchings in FIG. 8. Correspondingly, regions of the target where dense patterns are to be written will receive a higher exposure dose than those regions of lower density—since a greater percentage of the substrate has to be exposed. The LPd is a measure for this structural density, describing the average dose that will be delivered through a beam field frame contributing to the layout pattern to be generated on the target. In particular, the layout shown in FIG. 8 comprises three regions pd1, pd2, pd3 which are each associated with a respective specific value of local pattern density, which is sufficiently constant throughout the respective region. It will be recognized that in general, the regions associated with a given LPd—referred to as local pattern density regions (LPdRs)—have a complex shape, and the number of LPdRs may vary. For instance, a LPdR may be composed of separate component areas and/or surround areas of different LPd. It will further be appreciated that in a realistic layout, the transition of the LPd across the boundaries of LPdRs need not be completely sudden, but may be gradual over a narrow range; for simplicity, the depiction in FIG. 8 neglects this gradual transition. The target is exposed along scanning stripes str, which are demarcated by dashed lines in FIGS. 8 and 9. In the example shown, during imaging one of the scanning stripes, denoted s1, the pattern image pm (depicted as a dotted square) moves along the scanning stripe s1 along the scanning direction sd through a sequence of positions, of which two are highlighted in FIG. 8, namely, a nominal position p1 in region pd1, which has a lower LPd, to a nominal position p2 in the region pd2 of higher LPd.

As already mentioned, the inventors found that during writing of a pattern the actual position of the pattern image (i.e., the beam field frame at the current location of the beam field) is displaced from the nominal location of the beam field by a placement error which depends on the local pattern density; and, moreover, not so much on the current value of the LPd only, but on the evolution of the LPd.

Whenever the LPd changes during the writing process, this may—and usually will—affect the writing properties of the column. For instance, blanked and unblanked beams can lead to charge build-up in different components of the exposure apparatus, in particular components of the particle-optical column (such as electrostatic electrodes) or on the substrate (e.g. by resist charging), and such build-up will induce a spatial displacement of the beam field by electrostatic interaction, resulting in a registration offset for the image produced on the target surface. As the ratio of blanked to unblanked beams changes with the LPd, so will the distribution of built-up charge, albeit gradually. Besides electrostatic build-up, other (reversible) effects may contribute to a registration offset; for instance, a change of the LPd often involves increased activity of switching beamlets on and off, which will likely lead to a change of temperature of certain components of the particle-optical column, inducing a physical displacement of components (by thermal expansion) which in turn affects the imaging properties of the column (thermomechanical build-up). Furthermore, the local pattern density also has an impact on the work load of the blanking array, in which the electric currents running through its control circuitry and needed to control the blanking electrodes, potentially can build up a magnetic field of varying strength depending on the LPd. All these build-up effects are reversible, in that whenever the LPd changes to a given value, the optical system will tend towards a state which uniquely corresponds to the LPd value.

Figure 9:
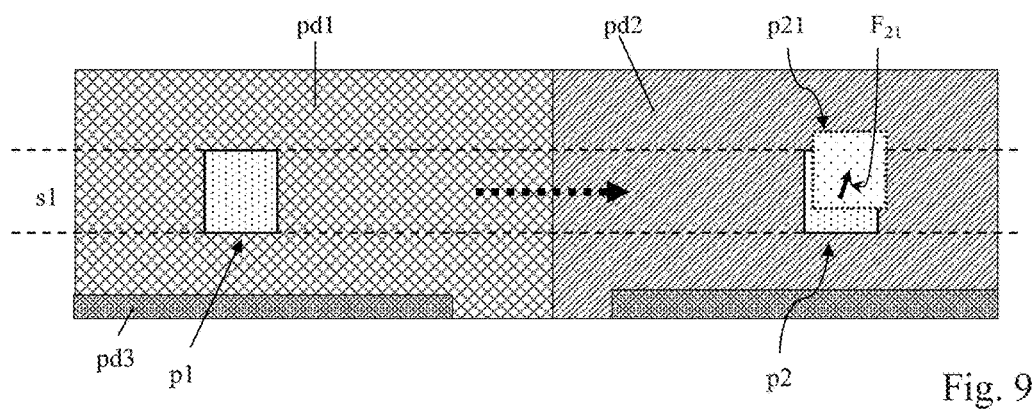
FIG. 9 is a detail of FIG. 8 showing positions of two exemplary beam field frames during a stripe exposure.

The registration offset is illustrated in FIG. 9, which shows a detail of FIG. 8 with the (nominal) positions p1, p2 of two exemplary beam field frames in the stripe s1. As the beam field moves from the position p1 to the nominal position p2, it crosses the boundary of region pd1 to enter region pd2. Since the region pd2 has a different LPd value, by the time the beam field arrives at the nominal position p2, the change in the imaging properties of the column, as induced by the LPd change for the two regions pd1 and pd2 will cause a relative displacement F21 of the beam field of the pattern image from the nominal position p2 to an actual position p21; therefore, it is necessary to move back the pattern image to the nominal position p2 by a compensation vector which is the inverse to the displacement F21, which is determined as described below. It is worthwhile to note that in the drawing the displacement F21 is greatly exaggerated for the sake of better visibility; in reality, the size of a typical displacement will be in the order of 0.1 nm to 20 nm, that is, typically at most the size of a pixel (20 nm), and the size of the beam field pm is a (large) multiple thereof, as mentioned above.

Local Pattern Density Evolution

Figure 10:
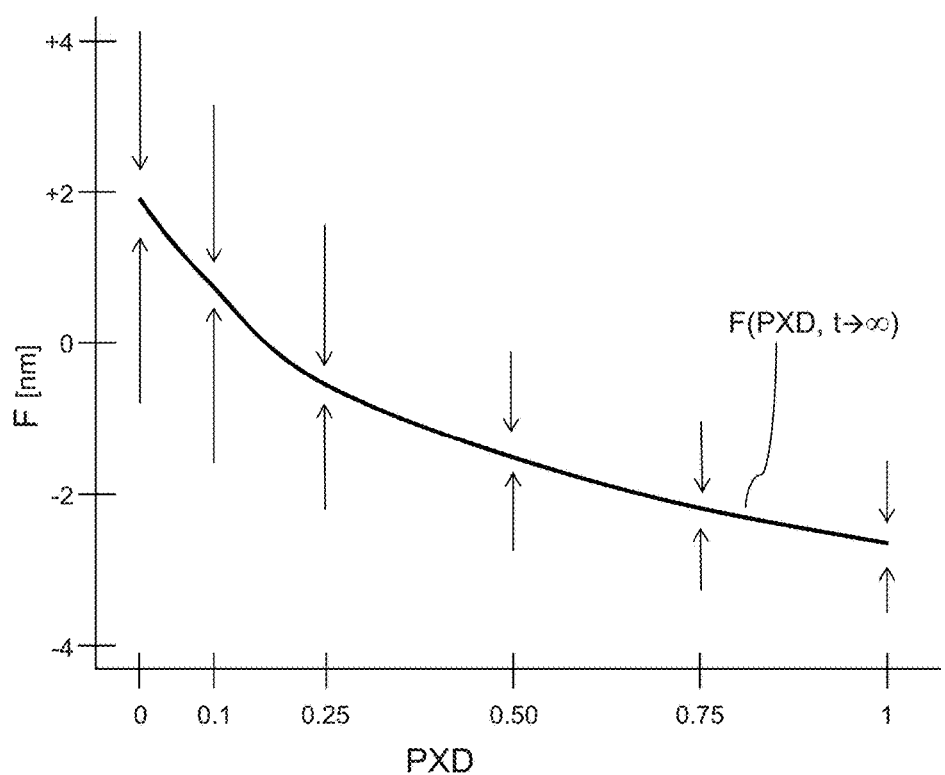
FIG. 10 depicts a typical example of the displacement F as a function of the LPd.

The beam placement error does not occur instantaneously when the local pattern density changes. Rather, the beam displacement evolves as a result of build-up effects as mentioned above, and will assume a stable value only after the actual value of LPd has not changed for a sufficiently long time. This stable value is called "asymptotical" displacement. FIG. 10 shows a typical example of the asymptotical displacement $f_0(LPd)=F(LPd, t\rightarrow\infty)$ as a function of the LPd, where the arrows indicate the asymptotic behavior of the actual displacement F for a given local pattern density held constant. For a given local pattern density LPd, the beam displacement F will continuously approach a unique and finite value of asymptotical displacement $F(LPd, t\rightarrow\infty)$ for the respective actual value of LPd.

Figure 11:
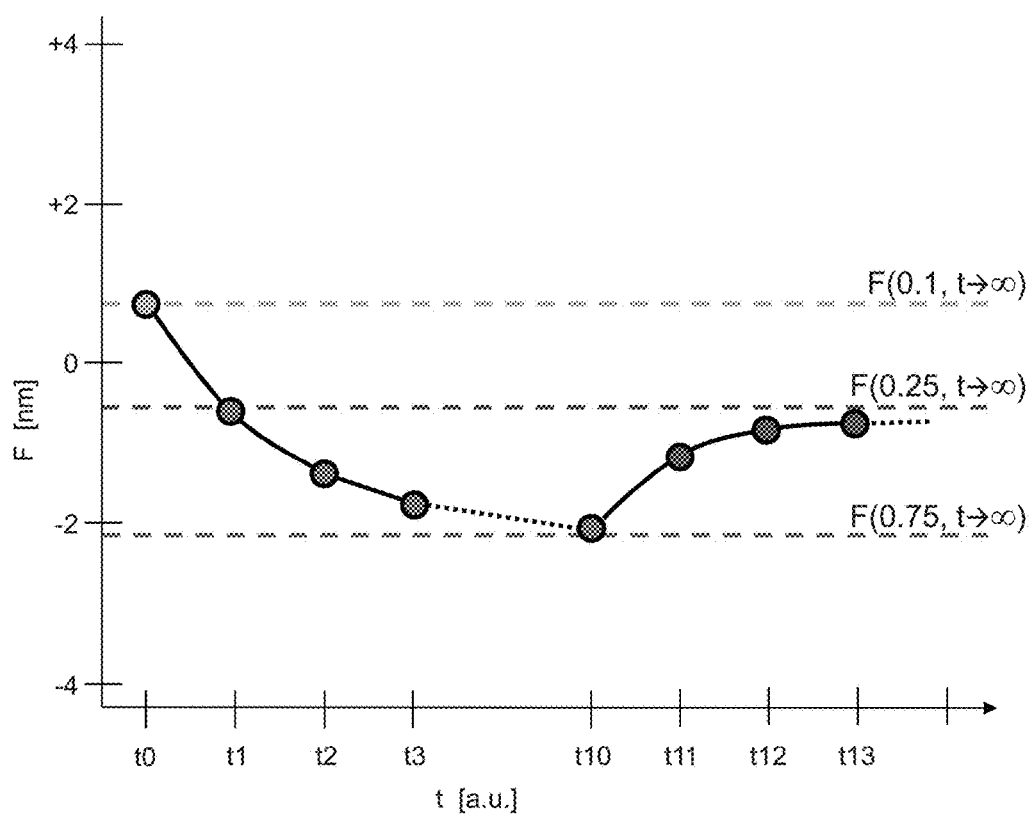
FIG. 11 shows an example of a temporal evolution of the beam displacement.

FIG. 11 shows an example of a temporal evolution of the beam displacement F, based on the asymptotical beam displacement curve $F(LPd, t\rightarrow\infty)$ of FIG. 10. The depiction in FIG. 11 is simplified in that only the situation at times t0, t1, . . . t13 are shown, which represent points in time separated by uniform time intervals of e.g. about 100 ms, whereas the intermediate times are omitted for simplification of the description of the LPd evolution, and also for better clarity. After writing beam field frames having LPd=0.1 for an extended time, the beam displacement at time t0 has settled close to the asymptotic value $F(LPd=0.1, t\rightarrow\infty)$. Then, at subsequent times t1, . . . , t10, beam field frames are written which have LPd close to 0.75. Consequently, the beam displacement gradually changes, in this case even changes direction since the absolute value crosses zero, slowly approaching $F(LPd=0.75, t\rightarrow\infty)$. Then, starting from time t11, beam field frames are written with a LPd of 0.25. Thus, with time t11, the beam displacement F again changes more rapidly, now moving towards the asymptotic value $F(LPd=0.25, t\rightarrow\infty)$.

Figure 12:
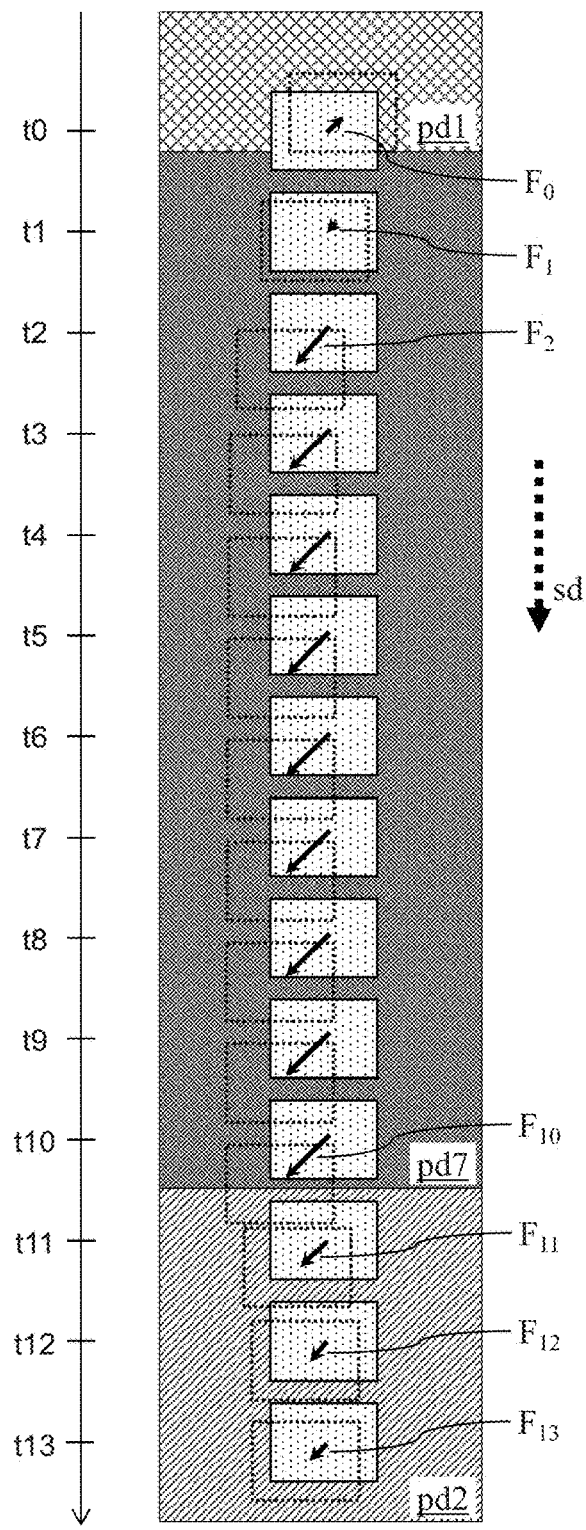
FIG. 12 shows a graphical representation of the beam displacement of FIG. 11.

FIG. 12 illustrates a graphical representation of the scenario of FIG. 11, depicting the nominal and displaced positions of the beam field frames while the beam image is moving along a stripe (which in this drawing runs vertical, rather than horizontal as in FIGS. 8 and 9) through regions pd1, pd7, and pd2, which have LPd values of 0.1, 0.75, and 0.25, respectively. The nominal positions of the beam field frames are shown as rectangles with dotted hatching, whereas the actual frame positions are shown with dotted boundaries.

It is important to note that the example of FIG. 12 is simplified in that only the beam field frames at times t0, t1, . . . t13 are shown (whereas all beam field frames between them are omitted, in order to avoid crowding the graphic with overlapping frames), and in that all displacements $F_0, F_1, F_2, \ldots F_{13}$ are depicted as oriented along the same direction. The skilled person is readily able to reconstruct a full representation from the explanations given here. Furthermore, the relative sizes of displacements $F_0$-$F_{13}$ with regard to the beam field frames are greatly exaggerated for reasons of better visibility. In practice, the values of the displacements are minute when compared to the size of the pattern image pm, but nonetheless, considerable when compared to the size and/or spacing of the individual pixels px within the pattern image, and thus, a drifting image field with realistic quantities of the displacement may lead to a measurable deterioration of the exposure quality.

Compensation of Registration Offset

To correct the placement errors of the image field that result from the registration offset as illustrated in FIGS. 9-12, the invention proposes a model that estimates the displacement given a recorded local pattern density. During operation, at time t, the image field is then shifted in the reverse of the displacement $\hat{F}(LPd, t)$ which is estimated by the model based on measured or calculated pattern densities LPd(t'), t'<t. Generally, the displacement behavior model offers a predicted value of the placement error. In particular, the model may include a mathematical expression dependent on the time, the local pattern density value of the current beam field frame, as well as the times and local pattern density values of preceding beam field frames, preferably within a time window of predetermined duration.

For instance, it is possible to implement a model by fitting a parametrized family of functions to observed deviations prior to operation. That is, the estimated displacement $\hat{F}(LPd, t)$ at a time t given the recorded local pattern density values LPd: $[-\infty, t]\rightarrow[0,1]$ up to time t is given by $\hat{F}(LPd, t)=\hat{F}_\theta(LPd, t)=L_\theta(LPd)$. Here, $L_\theta: \mathcal{F}([-\infty, t])\rightarrow\mathbb{R}^2$, where $\mathcal{F}([-\infty, t])$ is the space of real-valued functions on $[-\infty, t]$, is a (possibly non-linear) operator depending on a set of parameters $\theta$, which is chosen to optimally fit (e.g., in a least-squares sense) experimentally determined pattern densities and their corresponding deviations. The result of these functions is a two-component vector, as it can be visualized as two-dimensional offset vector within the plane of target surface. Generally, as mentioned earlier the displacement $\hat{F}(LPd, t)$ converges to a final value $f_0(LPd)$ which only depends on the LPd value itself.

A simple choice of model $L_\theta$ would be, for instance, a linear, time-invariant filter $$\hat{F}_\theta(LPd,t) = \vec{a} \int_{-\infty}^{t} LPd(t')d(t-t')dt'$$

(or the time-discrete analogue thereof) with a single exponential impulse response $$d(t) = e^{\frac{-t}{\tau}}$$

and displacement direction $\vec{a}$, here, the model parameters are $\theta = (\tau, \vec{a})$.

One may also combine several such terms (e.g., linearly) or include non-linear or effects or more complex behavior of the displacement directions.

Alternatively, it may be suitable to generate a model by specifying a differential equation (or difference equation, in the time-discrete setting) for the displacement or an underlying LPd dependent state (e.g., accumulated charge). For instance, the linear, time-invariant model above satisfies the ordinary differential equation $$\frac{\partial}{\partial t}\hat{F}(LPd, t) = \vec{a} LPd(t) + \frac{1}{\tau}\hat{F}(LPd, t).$$

This differential equation may further be discretized in time, e.g., by the Euler forward method, to get the update rule $$\hat{F}(LPd, t_{n+1}) \approx \hat{F}(LPd, t_n) + (t_{n+1} - t_n)\left(\vec{a} LPd(t_n) - \frac{1}{\tau}\hat{F}(LPd, t_n)\right).$$

This approach has the advantage that, in order to calculate the displacement $\hat{F}(LPd, t_{n+1})$ at time $t_{n+1}$ only the last estimated displacement $\hat{F}(LPd, t_n)$ and the current local pattern density $LPd(t_n)$ have to be known.

In a similar but more general manner, a nth-order ordinary differential equation $$g\left(t, LPd(t), \frac{\partial}{\partial t}LPd(t), \ldots, \frac{\partial^m}{\partial t^m}LPd(t),\right.$$
$$\left.\phi(LPd, t), \frac{\partial}{\partial t}\phi(LPd, t), \ldots, \frac{\partial^n}{\partial t^n}\phi(LPd, t)\right) = 0$$

for a state $\phi$ of the column (e.g. accumulated charge) generating the displacement can be chosen to achieve a certain desired behavior in time. The left hand side of the above equation is a (possibly non-linear) differential operator which corresponds to a physical model that describes the time evolution of the state $\phi$ in dependence of the LPd and its derivatives. In other words, the function g represents a physical model describing the effects causing the registration offset; its parameters can be determined from calibration experiments to sufficient accuracy for compensation of the registration offset. For example, the rule $$\hat{F}(LPd,t) = \vec{a}\,\phi(LPd,t), \text{ where } \phi \text{ satisfies}$$

$$\frac{\partial}{\partial t}\phi(LPd, t) = \frac{1}{\tau_c}(M - \phi(LPd, t))LPd(t) - \frac{1}{\tau_d}(\phi(LPd, t) - m),$$

combined with suitable initial conditions, results in a displacement in direction $\vec{a}$, charging exponentially at a rate depending on the local pattern density and the constant $\tau_c$, discharging with relaxation time $\tau_d$ and saturation at maximal and minimal displacements determined by M and m.

The relevant constants $\theta = (M, m, \tau_d, \tau_c, \vec{a})$ can be estimated, e.g., by fitting to measured displacements. If time-discretization is applied with the forward Euler method, the obtained update rule reads $$\phi(LPd, t_{n+1}) = \phi(LPd, t_n) + (M - \phi(LPd, t_n))LPd(t_n)(t_{n+1} - t_n)/\tau_c - (\phi(LPd, t_n) - m)(t_{n+1} - t_n)/\tau_d.$$

To estimate the next displacement $P(LPd, t_{n+1})$, again only the current (last estimated) state $\phi(LPd, t_n)$ and local pattern density $LPd(t_n)$ have to be known.

One may also use the approach to combine $n_\phi$ such states, so as to obtain $$\hat{F}(LPd,t) = \Sigma_{k=1}^{n_\phi} \vec{a}_k \phi_k(LPd,t),$$

where the states $\phi_k$ ($k=1, \ldots, n_\phi$) satisfy the differential equations $$\frac{\partial}{\partial t}\phi_k(LPd, t) = 1/(\tau_c)_k (M_k - \phi_k(LPd, t))LPd(t) - (\tau_d)_k(\phi_k(LPd, t) - m_k)$$

(or the time-discrete analogues) to achieve charging and discharging at a multitude of rates $(\tau_c)_1, \ldots, (\tau_c)_{n_\phi}$, $(\tau_d)_1, \ldots, (\tau_d)_{n_\phi}$, with different associated displacement directions $\vec{a}_1, \ldots, \vec{a}_{n_\phi}$ and minimal/maximal charges $m_1, M_1, \ldots, m_{n_\phi}, M_{n_\phi}$.

One possibility to obtain the relevant parameters $\theta$ is by fitting the estimated displacements $\hat{F}_\theta(LPd, t)$ to measured displacements $F(LPd, t)$ prior to operation (here, LPd again denotes the recorded local pattern density values up to time t). That is, by minimizing $D(\hat{F}_\theta, F)$, where D is a suitable metric, with respect to the set of parameters $\theta$ determining the displacement behavior. Examples of metrics include, e.g.:

$$D(f, g) = \Sigma_n |f(t_n) - g(t_n)|^2, \text{ and}$$

$$D(f, g) = \Sigma_n \left| \alpha|f(t_n) - g(t_n)| + \left| \frac{f(t_n) - f(t_{n-1})}{t_n - t_{n-1}} - \frac{g(t_n) - g(t_{n-1})}{t_n - t_{n-1}} \right| \right|^2,$$

where $\alpha$ is a weighting factor. In other words, the metrics may be norms (e.g. quadratic norms) built from the difference of the functions and/or difference of difference quotients of the functions, where necessary using suitable weights. When the latter metric is used with small $\alpha$, an additional emphasis is put on a good estimation of the change of displacement. This is relevant if the beam displacement includes fast-acting components that fluctuate rapidly and slow acting components creating a large displacement, which would otherwise dominate the error term to be minimized.

In suitable implementations of the invention, one of the models described above may be fitted to actual measurement data. Suitably, these measurement data may be recorded in a manner which covers the relevant time-scale, duration and/or local pattern density variation in order to ensure that the displacement as a function of time and local pattern density is reproducible within a given desired accuracy. In other words, in order to reveal said connection, it is often beneficial to provide methods that allow to track the LPd as well as the displacement of the beam field. According to the invention, the LPd at any time is derived according to one or a suitable combination of the following variants.

One efficient approach is to calculate the LPd directly from data from the datapath. In particular, this can efficiently be done at pixel packaging, stage 164 of FIG. 13, where the pixel data is sorted according to the placement grid sequence. Since, in this step, the exposure time of each pixel (or beamlet, respectively) of the beam field frame in terms of time-slots within the time intervals Tu is scheduled (FIG. 7B), one can derive the LPd by computing the ratio between the number of beamlets that are switched on and the total number of beams for each time-slot. Optionally, the value of this ratio may additionally be averaged over a larger time interval, suitably chosen with respect to the above mentioned models and displacement behavior of the MBMW. Since the data path operates in real-time, the actual LPd value needed for the displacement correction is also available in real-time. Note that, since the pixel data is buffered PBUF before pixels are actually exposed, the LPd evolution is actually known slightly in advance, which is beneficial with respect to synchronizing the correction scheme with the actual displacement.

Figure 14:
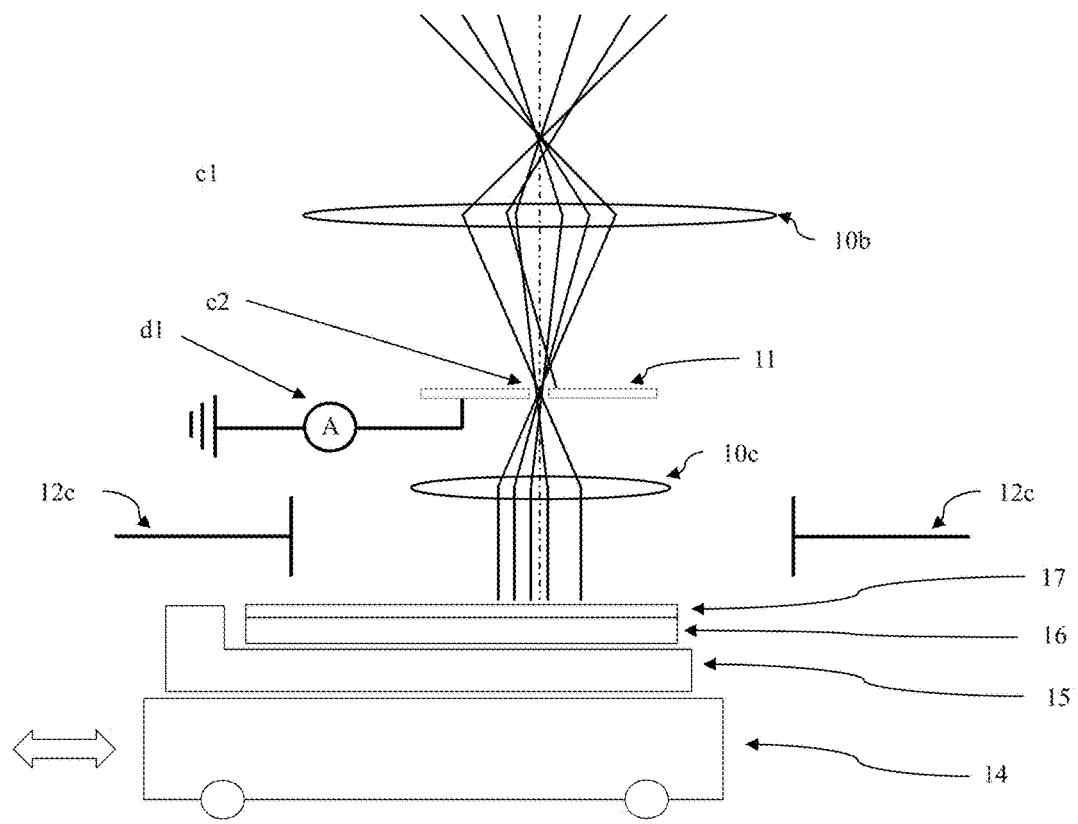
FIG. 14 shows a longitudinal sectional view of the lower part of the projecting column according to an embodiment of an MBW system of the type illustrated in FIG. 1, implementing a current measurement device associated with the stopping plate.

In another embodiment of the invention, the LPd is not calculated in the datapath, but instead is directly measured via physical sensors, which provide a series of measurements of the actual LPd value. Here, two specific implementations may be envisaged, which will be beneficial and feasible with state-of-the-art technology. The first case starts from the fact that, as mentioned above, deflected beamlets 52 are filtered out at the stopping plate 11 of the column (FIG. 1) according to the concept of the MBMW described in the introduction. Thus, at any time, the number of beamlets that reach the substrate, $N_S$, and the number of beamlets that reach the stopping plate, $N_B$, add up to the total number of available beamlets, $N_T$. Since the ratio $N_S/N_T$ is a measure of the LPd, and since, according to the fact $N_T=N_S+N_B$, this ratio can be rewritten as $1-N_B/N_T$, it will suffice for determining the ratio $N_B/N_T$. This value, however, can easily be specified by means of an electric current measurement device connected to the stopping plate 11. FIG. 14 illustrates a layout where an amperemeter d1 is electrically connected to the stopping plate 11. The amperemeter d1 serves as electric current measurement device to measure the small currents occurring in this situation, typically in the range of several pA (pico-Ampere). Here, it holds that $N_B/N_T=I_B/I_T$, where $I_B$ corresponds to the measured current at any time, and where the reference value $I_T$ is gauged by measuring the difference in the currents at the stopping plate between all beamlets blanked and all beamlets open in an additional calibration step.

Figure 15:
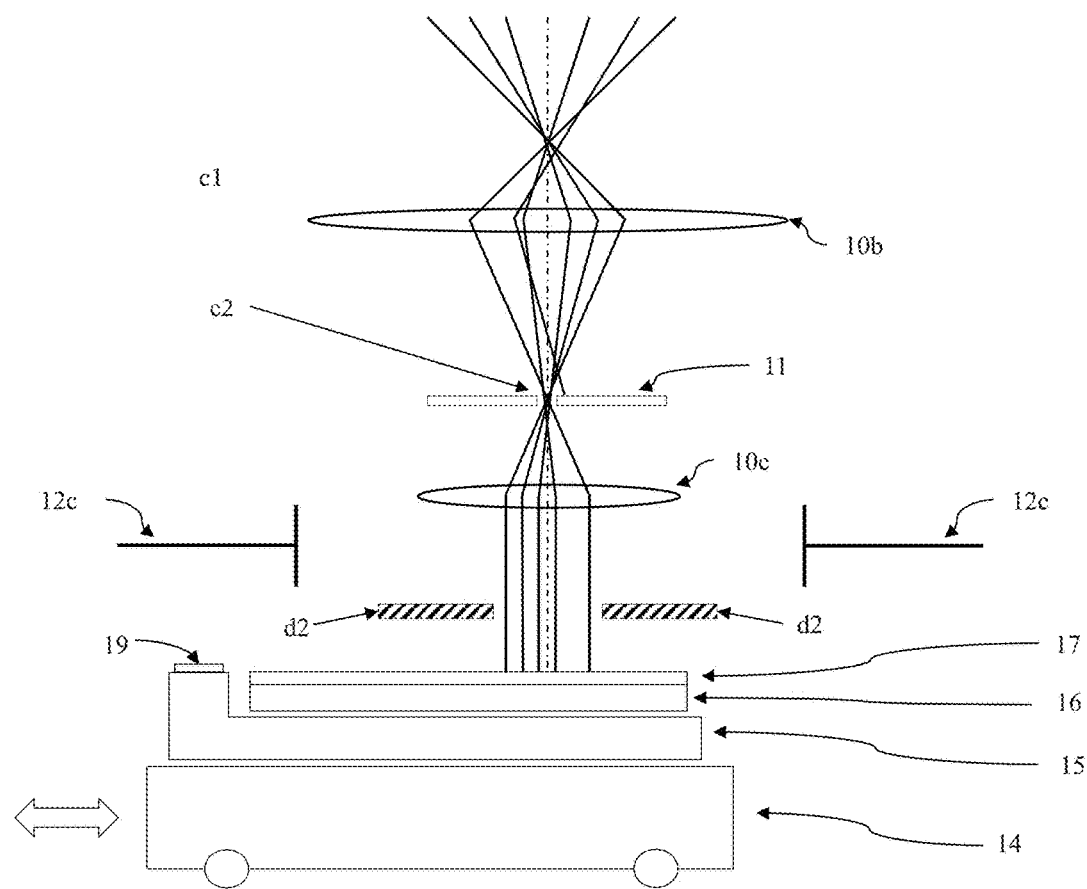
FIG. 15 shows a longitudinal sectional view of the lower part of the projecting column according to an embodiment of an MBW system of the type illustrated in FIG. 1, implementing a backscattered electron detection device arranged above the substrate.

In a second variant, a detector d2 measuring the number of beamlets arriving at the target may be used to determine the LPd. For instance, as illustrated in FIG. 15, a backscattered electron (BSE) detector d2 is placed at the end of the optical column. Since the number of backscattered electrons from the substrate correlates with the number of beamlets that reach the substrate, $N_S$, the signal from the BSE detector can be used to represent the LPd up to an multiplicative constant, or a monotone scaling function, respectively. Of course, all of above three variants, namely, via the data path, a current measurement device at the stopping plate, and via a final detector such as a BSE detector may also be used in combination, in order to obtain a yet improved estimate of the LPd.

Finally, as advantageous implementations for determining the displacement of the beam field frame in order to calibrate and fit one of above models, two further variant embodiments shall be discussed in the following.

Figure 16:
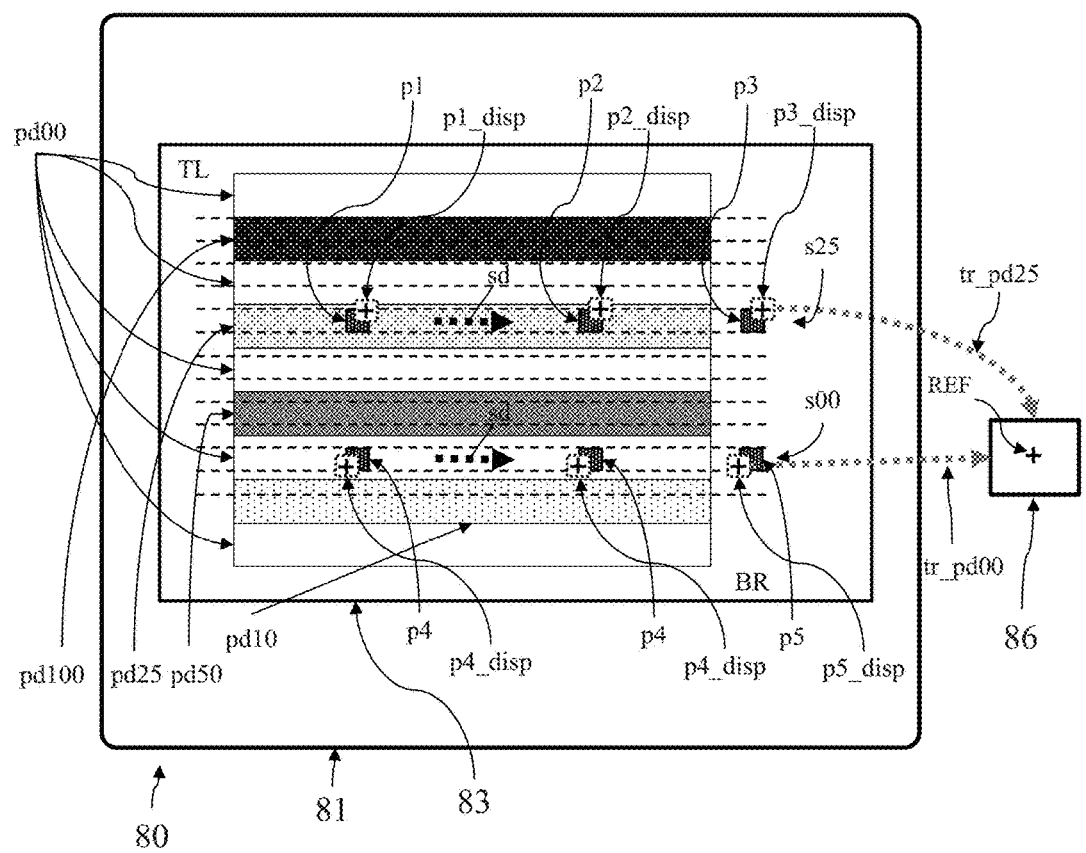
FIG. 16 depicts an exemplary test layout for deriving a model for LPd-related displacements by means of 'in-situ' methods.

FIG. 16 relates to the first variant, where a test exposure is prepared which contains substantial variations of the LPd over the exposure area. FIG. 16 illustrates an exemplary registration calibration target which is, e.g., designed for a typical target area of a 6" photomask blank 81 consisting of a 6"×6"×1"/4 quartz glass plate 80. It shows an electrically conducting masking layer with a mask pattern field 83 of typically 133 mm×104 mm. Within this mask pattern field there are areas of different pattern density, such as e.g. empty areas of 0% pattern density pd00, and pattern densities varying from 10% denoted by pd10, over pd25 with 25% and pd50 with 50%, up to pd100 with 100% pattern density. In this particular embodiment, it is not required that the quartz glass plate 80 is actually covered with an electron sensitive resist, since all displacements are measured 'in-situ' via a beam calibration target 86 (same as component 19 of FIG. 1) comprising a reference position target REF. In other words, in this realization, only a dummy exposure is performed on a test blank such as a chrome coated photomask blank. This means that, while the MBMW is actually performing the exposure and delivers dose and related LPd to the substrate in the usual manner, no attention is later paid to the structures on the target on which the exposure was performed. Instead, provided the time-scale in which the LPd related displacements change (a typical time-scale is in the order of minutes) is significantly larger than the time-scale that is needed to write a stripe (typically in the order of few seconds), it suffices to perform beam position measurements between stripes, i.e. after a stripe is finished and before the subsequent stripe is started. Note that these measurements need not necessarily be done between all stripes, but rather each of these measurements is performed after a reasonable number of stripes whose writing time does not exceed the time-scale in which the LPd related displacements changes. For example, still referring to FIG. 16, in one stripe s25 exposing the area pd25 with pattern density 25%, the displacements p1_disp and p2_disp relative to their nominal positions p1, p2, at two locations within the stripe (or, equivalently two points in times), are sufficiently the same, within the required precision of the LPd displacement model. Since the equivalent displacement still persists at the end of the stripe p3_disp relative to p3, and does not vanish instantaneously, the stage is directly moved along the trajectory s25 to the 'in-situ' beam calibration target 86, where the displacement can be observed. Suitably, this procedure may be repeated over the entire mask area, and for a sufficiently large number and an appropriate choice of pattern density variations. For example, the dummy exposure runs over the entire area of the mask pattern field 83 from top-left TL to bottom-right BR, while passing various pattern density transitions. Referring again to FIG. 16, exposing the entire area by exposing stripe after stripe from TL to BR, where in each stripe the beam field effectively moves in direction sd, the sequence of beam field frames undergoes the LPd transitions 0%→100%, 100%→0%, 0%→25%, 25%→0%, 0%→50%, 50%→0%, 0%→10%, and 10%→0%. Again, after finishing one or several stripes, the current displacement is measured at the beam calibration target 86. This concept of measuring the displacement has an accuracy that typically suffices for current demands on beam positioning precision. In particular, when the displacement is dominated by build-up effect taking place in the optical column rather than effects occurring on the target, such as for example substrate heating or charging.

Figure 17:
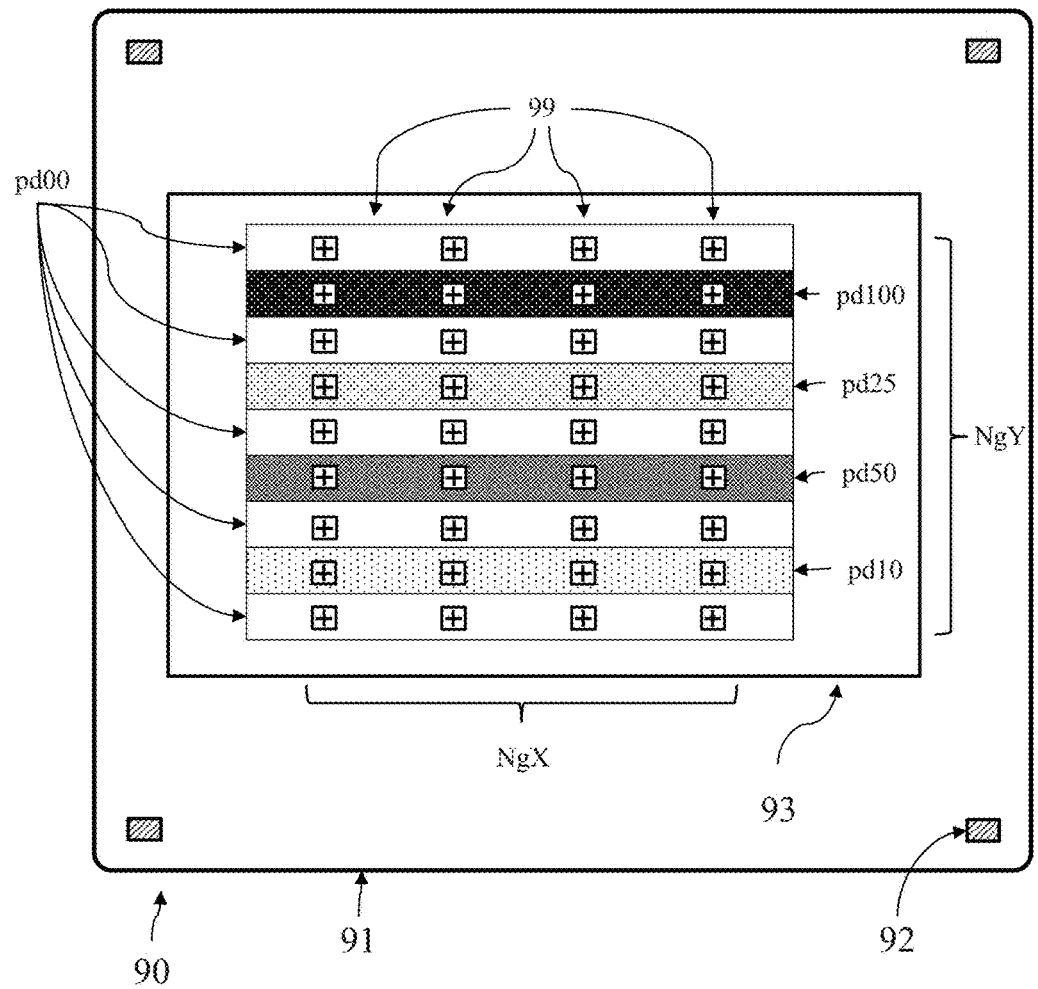
FIG. 17 depicts another exemplary test layout for deriving a model for LPd-related displacements by means of state-of-the-art mask metrology.
Figure 18:
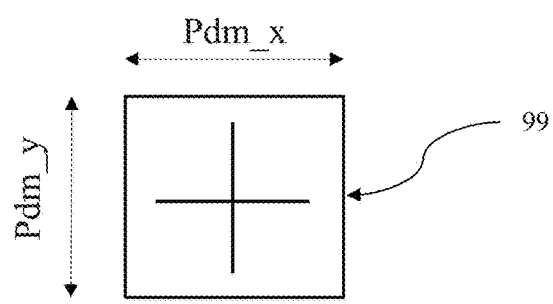
FIG. 18 shows a detail view of one marker of FIG. 17.
Figure 19:
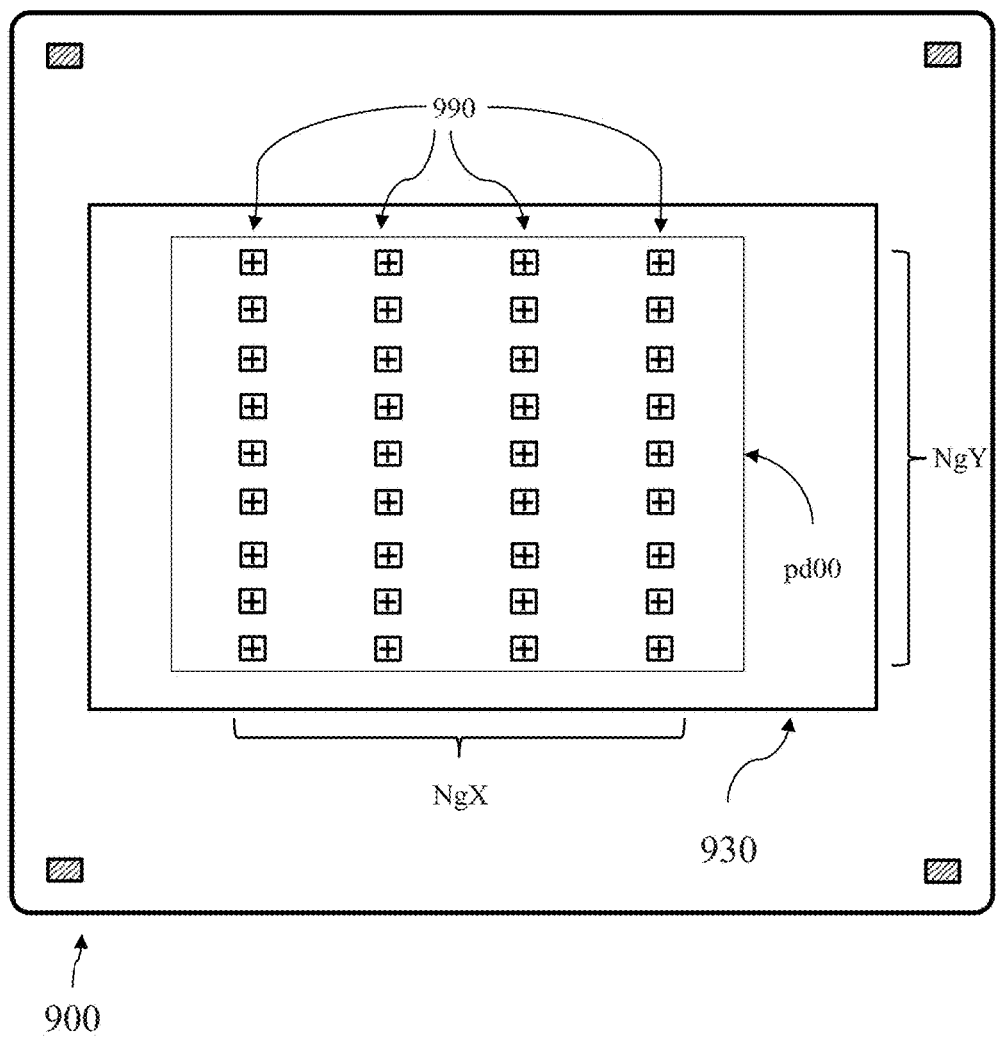
FIG. 19 depicts an example of a reference layout where the local pattern density is held constant.

FIG. 17 illustrates an example of the second variant of determining the displacement as a function of LPd and time, which may be used in place of or in addition to the first variant, in particular where the time-constants in which the displacement changes are small. FIG. 17 indicates a method wherein an analogous test exposure similar to the one previously mentioned is performed. Here, instead of measuring the displacements 'in-situ', a real exposure using an electron sensitive resist is performed, which is formed on a quartz glass plate 90 within a blank 91 (for instance 6" photomask, similar to that of FIG. 16). This setup requires a plurality of alignment patterns 92 for alignment purposes, as well as several markers 99 placed across the mask pattern field 93, which at a later stage are measured using a state-of-the-art mask registration metrology tool (not part of the invention). Preferably, the dimensions Pdm_x and Pdm_y of a single marker 99 are chosen such that they fit into a single beam field of the MBW. For example, for the MBMW implemented by the applicant, the height Pdm_y and width Pdm_x of each marker are smaller than 82 µm. Furthermore, the entity of all markers 99 preferably forms a regular, e.g. rectangular, grid arranged within the mask pattern field 93. FIG. 17 shows an example of such an arrangement with a grid of dimensions NgY=9 and NgX=4. Note that this illustration, which contains only a small number of grid points, is given merely for clarity, and that in an actual implementation, the number of grid points will be chosen much larger; such as for example NgY=32 and NgX=32, or NgY=27 and NgX=29, or even more. As the grid will typically be configured to cover a large area of the entire mask pattern field 83, increasing the number of grid points will effectively lead to a finer grid. Consequently, a larger number of grid points allows to observe the displacements with even higher accuracy. By exposing the grid embedded in areas with varying pattern density pd00, pd10, pd25, pd50, and pd100, the deviations relative to a grid with identical arrangement exposed on another test mask where the pattern density is held constant, e.g. a reference mask 900 with a zero pattern density pd00 within a corresponding mask pattern field 930 having markers 990 as illustrated in FIG. 19, is used to measure the relative displacement at all locations at any time by means of subsequent state-of-the-art mask registration metrology. This second variant has the advantage that also very rapid changes in the displacement order may be observed, and can be taken into account in one of the mathematical models stated above. In addition, this variant may become important in cases where resist effects, such as heating and charging, have only insignificant contribution to the LPd-dependent displacements.

The invention claimed is:

1. Method for writing a pattern on a target in a charged-particle multi-beam exposure apparatus comprising:
   generating a layout by exposing a plurality of beam field frames using a beam of electrically charged particles, wherein said beam field frames represent two-dimensional arrangements of pixels on the target and are written in a given time sequence, and wherein each beam field frame has a nominal position on the target, and in each beam field frame each pixel has a relative nominal position and an exposure value,
   providing a sequence of beam field frames and defining times of writing of said beam field frames,
   determining a local pattern density evolution relating to said sequence of beam field frames and pertinent writing times,
   defining a local pattern density value for each beam field frame as the average of the exposure values of the pixels in the respective beam field frame, the local pattern density values further defining exposure doses imparted to the target when exposing the respective beam field frames, thus causing a local pattern density evolution as a function of time by virtue of a time sequence of the beam field frames,
   determining placement error values for the beam field frames on the target, wherein each of the beam field frames have an actual position that deviates from its respective nominal position by the placement error as a result of build-up effects within said exposure apparatus based on the local pattern density evolution during the respective times of writing the beam field frames,
   utilizing in-situ beam position measurements performed in said exposure apparatus as part of a calibration procedure thereof to establish and calculate parameters of a predetermined displacement behavior model for describing a predicted value of the placement error as a function of local pattern density and time,
   predicting values of the placement error for the beam field frames based on the local pattern density evolution and said displacement behavior model, and
   repositioning the position of the respective beam field frame for the compensating placement error for each of the beam field frames using the respective predicted value of the placement error for the respective beam field frame.

2. Method according to claim 1, wherein in the step of determining the local pattern density evolution, a sequence of subsequent time intervals is defined, each time interval containing the times of writing of a plurality of beam field frames, and for each of said time intervals a representative local pattern density is determined from the respective plurality of beam field frames contained in the respective time interval.

3. Method according to claim 1, wherein the local pattern density evolution is determined from a series of measurements of actual local pattern density, provided by a sensor device provided in the exposure apparatus.

4. Method according to claim 3, wherein the sensor device is a measurement device for an electric current arriving at the target, preferably a detector for backscattering of charged particles from the target.

5. Method according to claim 3, wherein the sensor device is a measurement device for parts of the beam of electrically charged particles that are not arriving at the target, preferably a current detector connected to a stopping plate for blanked beam parts.

6. Method according to claim 1, further comprising:
   providing a beam deflection device enabling a repositioning action on a beam field frame as generated on the target according to a desired repositioning distance.

7. Method according to claim 1, wherein the step of repositioning the position of the respective beam field frame includes:
   shifting the position of the respective beam field frame by a distance which is the inverse of the respective predicted value of the placement error.

8. A method for writing a pattern on a target in a charged-particle multi-beam exposure apparatus comprising:
   generating a layout by exposing a plurality of beam field frames using a beam of electrically charged particles, wherein said beam field frames represent two-dimensional arrangements of pixels on the target and are written in a given time sequence, and wherein each beam field frame has a nominal position on the target, and in each beam field frame each pixel has a relative nominal position and an exposure value, providing a sequence of beam field frames and defining times of writing of said beam field frames, determining a local pattern density evolution relating to said sequence of beam field frames and pertinent writing times, defining a local pattern density value for each beam field frame as the average of the exposure values of the pixels in the respective beam field frame, the local pattern density values further defining exposure doses imparted to the target when exposing the respective beam field frames, thus causing a local pattern density evolution as a function of time by virtue of a time sequence of the beam field frames, determining placement error values for the beam field frames on the target, wherein each of the beam field frames have an actual position that deviates from its respective nominal position by the placement error as a result of build-up effects within said exposure apparatus based on the local pattern density evolution during the respective times of writing the beam field frames, establishing parameters of a predetermined displacement behavior model for describing a predicted value of the placement error as a function of local pattern density and time, predicting values of the placement error for the beam field frames based on the local pattern density evolution and said displacement behavior model, and repositioning the position of the respective beam field frame for the compensating placement error for each of the beam field frames using the respective predicted value of the placement error for the respective beam field frame; and wherein the parameters of said displacement behavior model are established by running a sequence of test writing processes in said exposure apparatus, said test writing processes performing a sequence of exposures of test patterns having different values of local pattern density, and preferably in varying sequences in time, wherein in each test writing process the value of placement error is measured as a function of time and/or local pattern density, and the parameters are calculated from the values of placement error obtained during said test writing processes.

9. Method according to claim 8, wherein a beam calibration target (86) is used during said sequence of test writing processes in said exposure apparatus, said beam calibration target comprising a number of a position marker devices located at defined positions on the beam calibration target.

10. Method according to claim 8, wherein a mask metrology target is used during said sequence of test writing processes in said exposure apparatus, said mask metrology target having a surface being provided with a plurality of markers arranged in a regular array thereon.

11. Method according to claim 8, wherein the local pattern density evolution is determined from a series of measurements of actual local pattern density, provided by a sensor device provided in the exposure apparatus.

12. Method according to claim 11, wherein the sensor device is a measurement device for an electric current arriving at the target, preferably a detector for backscattering of charged particles from the target.

13. Method according to claim 11, wherein the sensor device is a measurement device for parts of the beam of electrically charged particles that are not arriving at the target, preferably a current detector connected to a stopping plate for blanked beam parts.

14. A method for writing a pattern on a target in a charged-particle multi-beam exposure apparatus comprising:

generating a layout by exposing a plurality of beam field frames using a beam of electrically charged particles, wherein said beam field frames represent two-dimensional arrangements of pixels on the target and are written in a given time sequence, and wherein each beam field frame has a nominal position on the target, and in each beam field frame each pixel has a relative nominal position and an exposure value, providing a sequence of beam field frames and defining times of writing of said beam field frames, determining a local pattern density evolution relating to said sequence of beam field frames and pertinent writing times, defining a local pattern density value for each beam field frame as the average of the exposure values of the pixels in the respective beam field frame, the local pattern density values further defining exposure doses imparted to the target when exposing the respective beam field frames, thus causing a local pattern density evolution as a function of time by virtue of a time sequence of the beam field frames, determining placement error values for the beam field frames on the target, wherein each of the beam field frames have an actual position that deviates from its respective nominal position by the placement error as a result of build-up effects within said exposure apparatus based on the local pattern density evolution during the respective times of writing the beam field frames, establishing parameters of a predetermined displacement behavior model for describing a predicted value of the placement error as a function of local pattern density and time, predicting values of the placement error for the beam field frames based on the local pattern density evolution and said displacement behavior model, and repositioning the position of the respective beam field frame for the compensating placement error for each of the beam field frames using the respective predicted value of the placement error for the respective beam field frame; and wherein said displacement behavior model describes a predicted value of the placement error as a mathematical expression dependent on the time, the local pattern density value of the current beam field frame, as well as the times and local pattern density values of preceding beam field frames, preferably within a time window of predetermined duration.

15. Method of claim 14, with said mathematical expression consisting of a sum of a time-constant base value, which depends on the local pattern density value of the current beam field frame, and at least one decay-function term, which depends on local pattern density values of preceding beam field frames and contains a decay function $D(X, t)$ of time, i.e., $$\hat{F}(LPd, t) = f_0(LPd(t)) + \Sigma_{t'<t} D(LPd(t'), t'-t),$$

wherein $f_0$ is a final value of displacement as a function of the local pattern density the decay function D describes the decay from start value (X) as function of the time (t), and where D is selected from the group consisting of a decreasing exponential function ($e^{-t/\tau}$), inverse functions of time relative to a respective reference time (($t-t_0)^{-1}$, $(t-t_0)^{-n}$), and combinations thereof.

16. Method of claim 14, with said mathematical expression being represented as a function of a state function ($\phi$)(t)) which, for each point in time of exposure (t) is calculated as a function of the values of the local pattern density of preceding points in time and of the state function calculated for preceding points in time, i.e., $$\hat{F}(LPd, t_{n+1}) = f(\phi(t_{n+1})), \phi(t_{n+1}) = g(LPd(t_{n-j}), \ldots, LPd(t_n), \phi(t_{n-k}), \ldots, \phi(t_n))$$

wherein the function f( ) describes the displacement behavior as function of the state function, and g( ) describes the time evolution of the state function as a function of the local pattern density and, if applicable, its time derivatives.

17. Method according to claim 14, wherein build-up effects are considered in said displacement behavior model which are due to current variations in the beam of electrically charged particles, where said current variations cause time-variant electric charging of at least one of the components in the apparatus and the substrate.

18. Method according to claim 14, wherein build-up effects are considered in said displacement behavior model which are due to time-variant heating and resulting thermo-mechanical deformation of at least one of components in the apparatus and the substrate.

19. A method for writing a pattern on a target in a charged-particle multi-beam exposure apparatus comprising:

generating a layout by exposing a plurality of beam field frames using a beam of electrically charged particles, wherein said beam field frames represent two-dimensional arrangements of pixels on the target and are written in a given time sequence, and wherein each beam field frame has a nominal position on the target, and in each beam field frame each pixel has a relative nominal position and an exposure value, providing a sequence of beam field frames and defining times of writing of said beam field frames, determining a local pattern density evolution relating to said sequence of beam field frames and pertinent writing times, defining a local pattern density value for each beam field frame as the average of the exposure values of the pixels in the respective beam field frame, the local pattern density values further defining exposure doses imparted to the target when exposing the respective beam field frames, thus causing a local pattern density evolution as a function of time by virtue of a time sequence of the beam field frames, determining placement error values for the beam field frames on the target, wherein each of the beam field frames have an actual position that deviates from its respective nominal position by the placement error as a result of build-up effects within said exposure apparatus based on the local pattern density evolution during the respective times of writing the beam field frames, establishing parameters of a predetermined displacement behavior model for describing a predicted value of the placement error as a function of local pattern density and time, predicting values of the placement error for the beam field frames based on the local pattern density evolution and said displacement behavior model, and repositioning the position of the respective beam field frame for the compensating placement error for each of the beam field frames using the respective predicted value of the placement error for the respective beam field frame; and wherein the local pattern density evolution is determined from data contained in the sequence of beam field frames and pertinent writing times, namely, from data obtained from a data path which serves to calculate data defining a desired pattern into said sequence of beam field frames.

* * * * *